United States Patent
Jesionowski et al.

(10) Patent No.: US 10,426,057 B2
(45) Date of Patent: Sep. 24, 2019

(54) INTEGRATED COOLING IN AUTOMATED TAPE LIBRARIES

(71) Applicant: International Business Machines Corporation, Armonk, NY (US)

(72) Inventors: Leonard G. Jesionowski, Tucson, AZ (US); Michael P. McIntosh, Tucson, AZ (US); Shawn M. Nave, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 15/146,833

(22) Filed: May 4, 2016

(65) Prior Publication Data
US 2017/0323666 A1    Nov. 9, 2017

(51) Int. Cl.
*H05K 7/20*    (2006.01)
*G11B 33/14*    (2006.01)
*G11B 5/008*    (2006.01)
*G11B 15/60*    (2006.01)

(52) U.S. Cl.
CPC ..... *H05K 7/20172* (2013.01); *G11B 5/00813* (2013.01); *G11B 15/60* (2013.01); *G11B 33/144* (2013.01); *H05K 7/202* (2013.01); *H05K 7/20609* (2013.01); *H05K 7/20145* (2013.01)

(58) Field of Classification Search
CPC ... G11B 33/144; G11B 5/00813; G11B 15/60; G11B 23/021; H05K 7/20609; H05K 7/202; H05K 7/20172; H05K 7/20145; H05K 7/20009; H05K 7/20136

USPC ..................... 165/80.2; 361/679.36
See application file for complete search history.

(56) References Cited

U.S. PATENT DOCUMENTS

| 4,449,579 | A  | * | 5/1984 | Miyazaki | F28D 15/00 165/104.33 |
| 6,676,026 | B1 | * | 1/2004 | McKinley | G11B 15/6835 165/80.3 |
| 6,854,275 | B2 |   | 2/2005 | Evans    |  |
| 6,867,967 | B2 | * | 3/2005 | Mok      | G06F 1/16 236/49.3 |
| 6,924,981 | B2 | * | 8/2005 | Chu      | H05K 7/20754 165/104.33 |

(Continued)

FOREIGN PATENT DOCUMENTS

WO    2008128311 A2    10/2008

OTHER PUBLICATIONS

EIC Solutions, "Protector Series IT Rack Enclosure," EIC Solutions Specifications, 2015, pp. 1-3.

(Continued)

*Primary Examiner* — Devon Russell
(74) *Attorney, Agent, or Firm* — Zilka-Kotab, P.C.

(57) ABSTRACT

A system, according to one embodiment, includes: a first frame of an automated tape library, wherein an interior of the first frame includes one or more tape drives, an area for storing tape cartridges, and an accessor channel, and a first air conditioning unit coupled to the first frame. The first air conditioning unit is configured to cool the interior of the first frame. Moreover, one or more fans of the one or more tape drives are configured to generate air flow within the interior of the first frame. Other systems, computer-implemented methods, and computer program products are described in additional embodiments.

18 Claims, 14 Drawing Sheets

(56) References Cited

U.S. PATENT DOCUMENTS

| | | | |
|---|---|---|---|
| 7,325,406 B2 | 2/2008 | Lee et al. | |
| 7,430,118 B1* | 9/2008 | Noteboom | H05K 7/20745 |
| | | | 165/104.33 |
| 7,751,191 B2 | 7/2010 | Kakikawa et al. | |
| 7,752,858 B2* | 7/2010 | Johnson | H05K 7/20836 |
| | | | 361/695 |
| 9,317,358 B2* | 4/2016 | Foster | G06F 11/08 |
| 9,814,160 B2* | 11/2017 | Slessman | H05K 7/20145 |
| 9,894,808 B2* | 2/2018 | Czamara | H05K 7/20745 |
| 2004/0020224 A1* | 2/2004 | Bash | F25B 5/02 |
| | | | 62/228.4 |
| 2004/0025515 A1 | 2/2004 | Evans | |
| 2005/0122616 A1* | 6/2005 | Hoelsaeter | G11B 5/86 |
| | | | 360/92.1 |
| 2009/0056910 A1* | 3/2009 | Mallia | H05K 7/20754 |
| | | | 165/80.3 |
| 2009/0177314 A1* | 7/2009 | Greco | G11B 15/6835 |
| | | | 700/218 |
| 2009/0266511 A1* | 10/2009 | Yang | G11B 33/144 |
| | | | 165/80.2 |
| 2012/0097360 A1 | 4/2012 | Ohba et al. | |
| 2013/0019124 A1* | 1/2013 | Grimshaw | G06F 11/2015 |
| | | | 714/24 |
| 2013/0128455 A1* | 5/2013 | Koblenz | H05K 7/20836 |
| | | | 361/692 |
| 2014/0260397 A1 | 9/2014 | Agnaou et al. | |

OTHER PUBLICATIONS

"IT Rack Enclosure for Servers, Switches & Network Equipment," Epic Solutions, 2015, pp. 1-3.
"Air Conditioned Cabinet," Server Room Furniture, 2015, pp. 1-4.

* cited by examiner

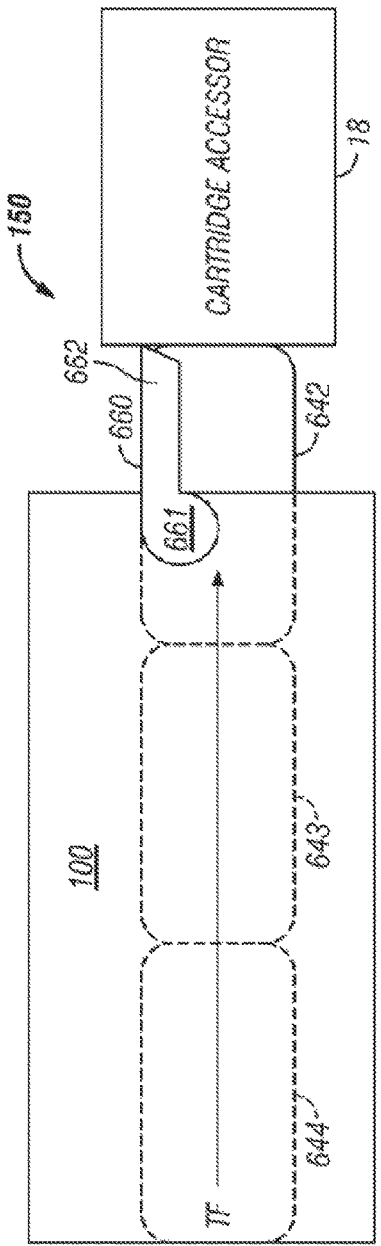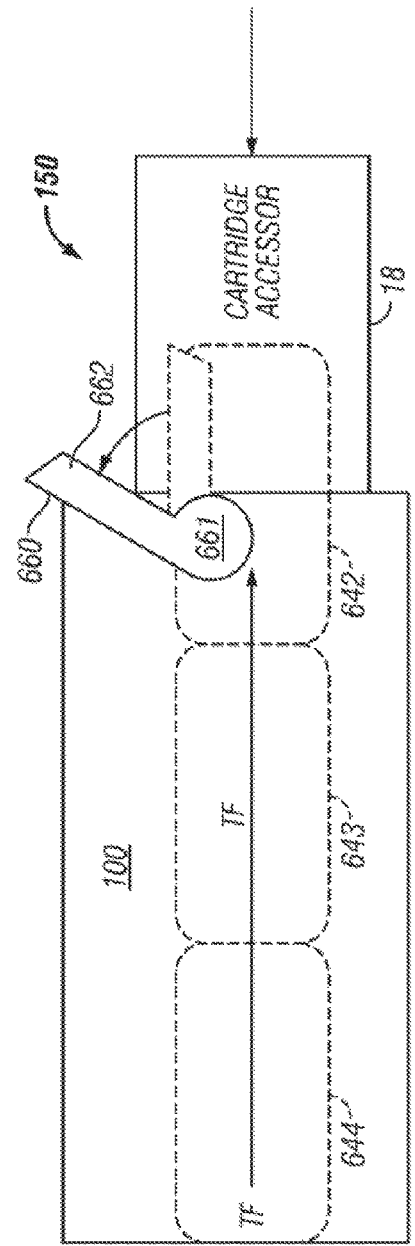

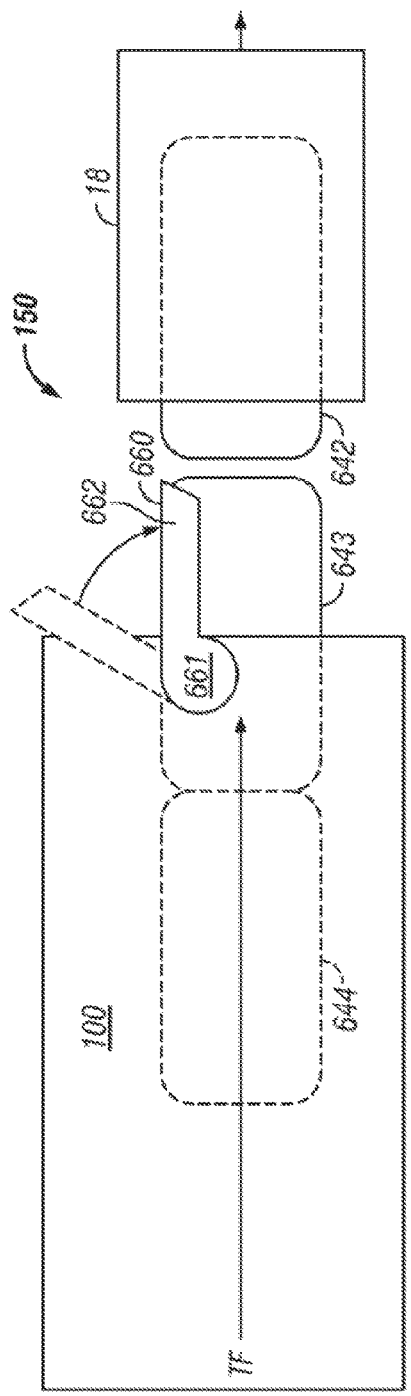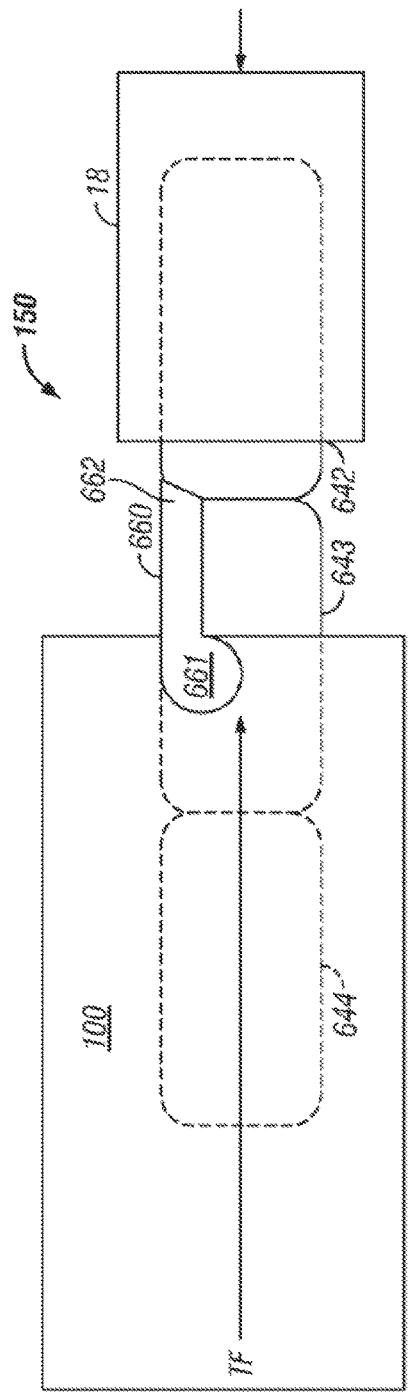

INTEGRATED COOLING IN AUTOMATED TAPE LIBRARIES

BACKGROUND

The present invention relates to data storage systems, and more particularly, this invention relates to regulating the temperature and humidity of tape libraries.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, CompactFlash™, Smartmedia™, Memory Stick™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more accessors. Such accessors have grippers for physically retrieving the selected data storage cartridges from the storage slots within the automated data storage library and transporting such cartridges to the data storage drives by moving, for example, in the horizontal (X) and vertical (Y) directions.

In an effort to increase storage capacity, deep slot technology allows for storage cells that contain more than a single data storage cartridge. Such storage libraries allow for higher density, or more cartridges stored per square foot. In "deep slot" libraries, two or more cartridges may be stored in a multi-cartridge deep slot cell, arrayed in series, one behind the other, in tiers ranging from a front-most tier to a rearmost tier.

Efforts to improve the performance of traditional data centers attempt to minimize the cost of processing and storing data. One option that is employed to reduce operational costs of datacenters is to run the equipment in the datacenter at the high end of its environmental operational limits, thereby allowing for cooling of the datacenter to be reduced. In other words, datacenters are running increasingly hot and more humid conditions than traditional datacenters in an attempt to reduce operating costs. Although this strategy may be effective when applied to disk and/or flash data storage environments, magnetic tape is more susceptible to degradation when exposed to these unfavorable conditions. Therefore, this option is not available for magnetic tape libraries.

SUMMARY

A system, according to one embodiment, includes: a first frame of an automated tape library, wherein an interior of the first frame includes one or more tape drives, an area for storing tape cartridges, and an accessor channel, and a first air conditioning unit coupled to the first frame. The first air conditioning unit is configured to cool the interior of the first frame. Moreover, one or more fans of the one or more tape drives are configured to generate air flow within the interior of the first frame.

A system, according to another embodiment, includes: a first frame of an automated tape library, wherein an interior of the first frame includes an area for storing tape cartridges and an accessor channel, a first air conditioning unit coupled to the first frame, a second frame of the automated tape library, wherein an interior of the second frame includes an area for storing tape cartridges and a second accessor channel. The first air conditioning unit is configured such that a cooling capacity of the first air conditioning unit is able to cool the interiors of the first and second frames. Moreover, the first air conditioning unit is configured to have a scalable cooling capacity.

A computer-implemented method, according to yet another embodiment, includes: monitoring interior conditions of multiple frames of an automated tape library, and scaling a cooling capacity of the air conditioning units based at least in part on the interior conditions. An interior of each of the multiple frames includes an area for storing tape cartridges and an accessor channel. Moreover, a unique air conditioning unit is directly coupled to each of at least some of the multiple frames.

BRIEF DESCRIPTION OF THE DRAWINGS

FIGS. 8A-8D are partial side views of a cartridge blocking mechanism according to one embodiment.

DETAILED DESCRIPTION

Figure 1:
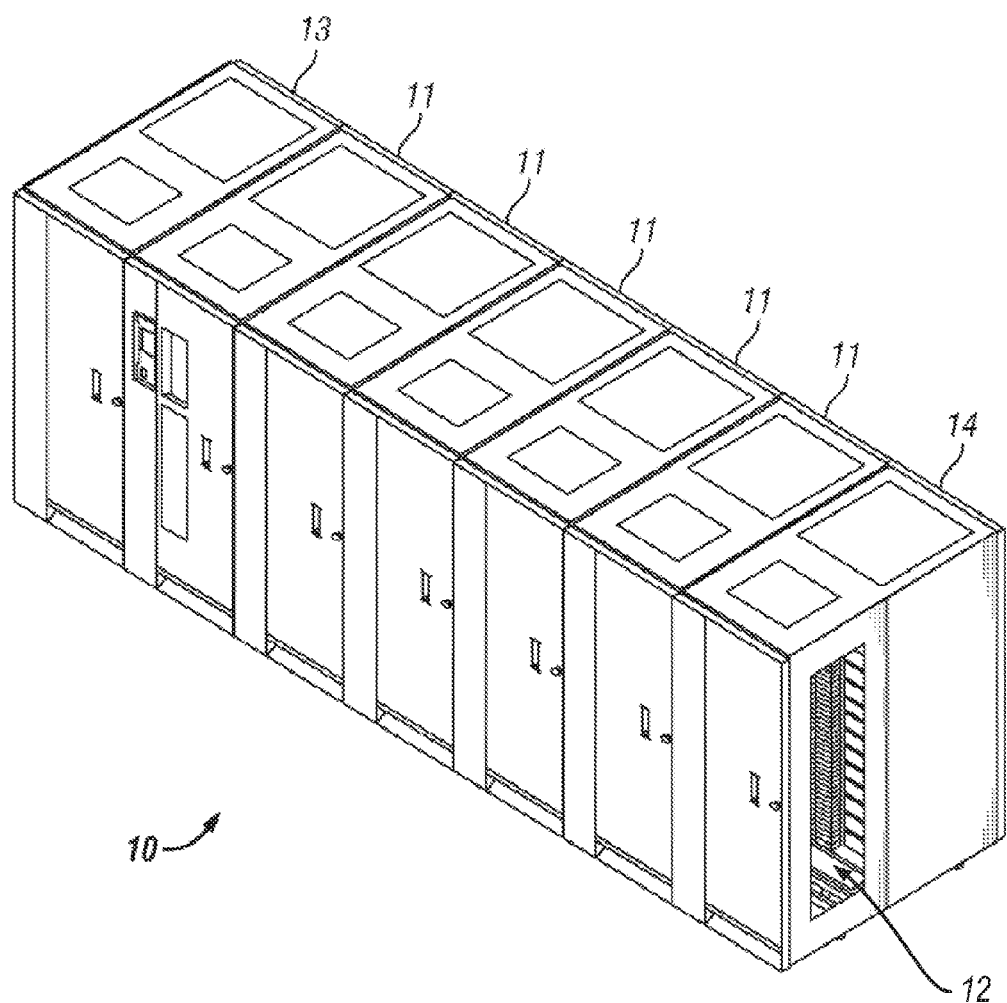
FIG. 1 is a perspective view of an automated data storage library according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of storage systems, as well as operation and/or component parts thereof. As will be described in further detail below, various embodiments described herein are able to provide data storage systems, more specifically, automated tape libraries, with climate control capabilities integrated with the automated tape library. As a result, favorable conditions (e.g., temperature, humidity, presence of contaminants, etc.) may be maintained for the tape drives and/or media which may be stored in the library frame. Moreover, these favorable conditions may enable a system to provide the appropriate temperature, humidity, contaminant level, etc. regardless of whether the library is installed in an unfavorable (e.g., hot and/or wet) datacenter location.

In one general embodiment, a system includes: a first frame of an automated tape library, wherein an interior of the first frame includes one or more tape drives, an area for storing tape cartridges, and an accessor channel, and a first air conditioning unit coupled to the first frame. The first air conditioning unit is configured to cool the interior of the first frame. Moreover, one or more fans of the one or more tape drives are configured to generate air flow within the interior of the first frame.

In another general embodiment, a system includes: a first frame of an automated tape library, wherein an interior of the first frame includes an area for storing tape cartridges and an accessor channel, a first air conditioning unit coupled to the first frame, a second frame of the automated tape library, wherein an interior of the second frame includes an area for storing tape cartridges and a second accessor channel. The first air conditioning unit is configured such that a cooling capacity of the first air conditioning unit is able to cool the interiors of the first and second frames. Moreover, the first air conditioning unit is configured to have a scalable cooling capacity.

In yet another general embodiment, a computer-implemented method includes: monitoring interior conditions of multiple frames of an automated tape library, and scaling a cooling capacity of the air conditioning units based at least in part on the interior conditions. An interior of each of the multiple frames includes an area for storing tape cartridges and an accessor channel. Moreover, a unique air conditioning unit is directly coupled to each of at least some of the multiple frames.

Figure 2:
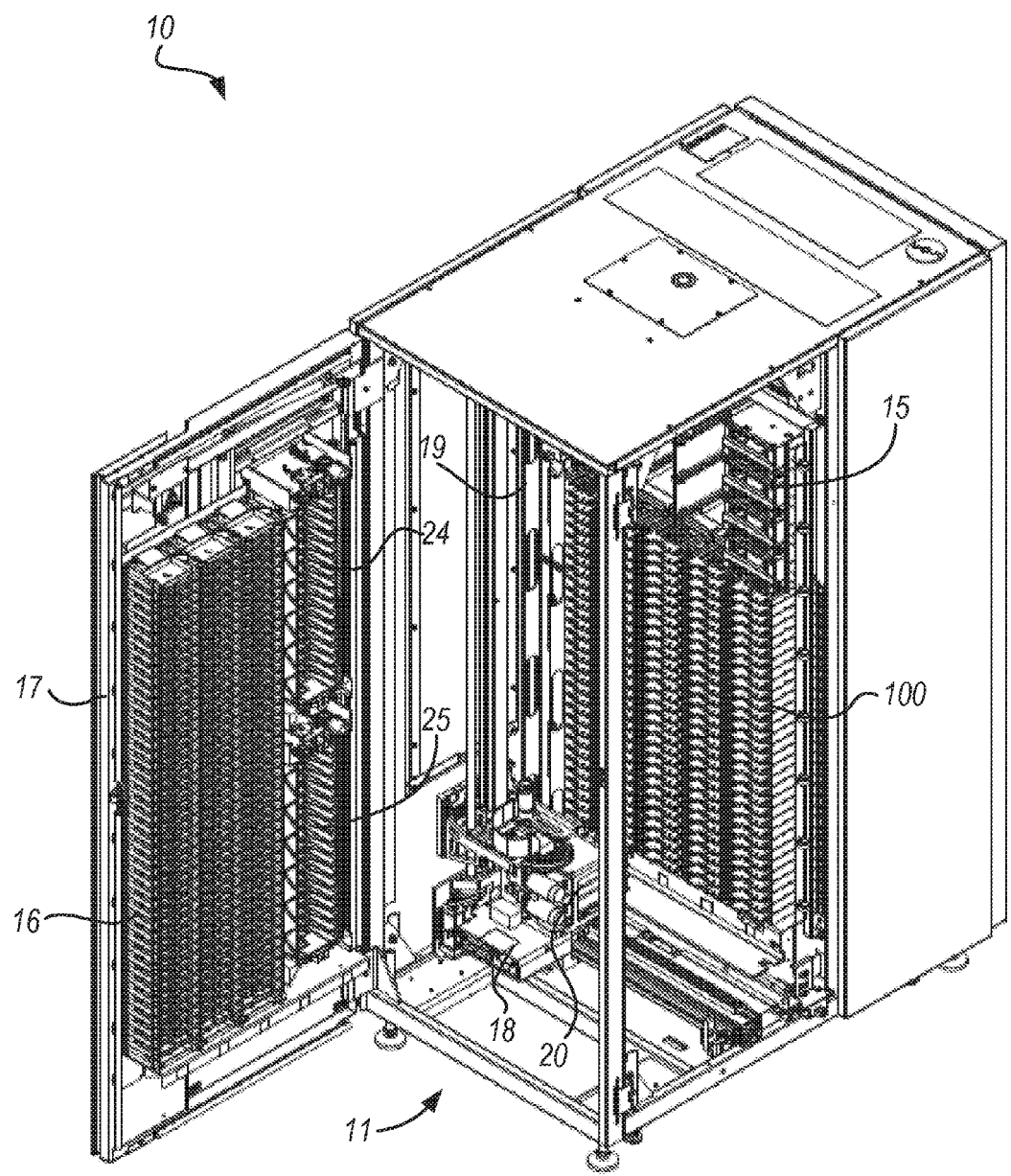
FIG. 2 is a perspective view of a storage frame from the data storage library of FIG. 1.

FIGS. 1-2 illustrate an automated data storage library 10 which stores and retrieves data storage cartridges, containing data storage media (not shown), from multi-cartridge deep slot cells 100 and single cartridge storage slots 16. An example of an automated data storage library which has a similar configuration as that depicted in FIGS. 1-2, and may be implemented with some of the various approaches herein is the IBM 3584 UltraScalable Tape Library. Moreover, it should be noted that references to "data storage media" herein refer to data storage cartridges, and for purposes of the present application, the two terms may be used synonymously.

The library 10 of FIG. 1 comprises a left hand service bay 13, one or more storage frames 11, and right hand service bay 14. As will be discussed in further detail below, a frame may comprise an expansion component of the library. Thus, storage frames may be added or removed to expand or reduce the size and/or functionality of the library. According to different approaches, frames may include additional storage slots, deep slot cells, drives, import/export stations, accessors, operator panels, etc. Moreover, an accessor channel 12 preferably extends between the storage frames and bays of the present embodiment, thereby allowing an accessor to move between frames.

FIG. 2 shows an exemplary embodiment of a storage frame 11, which acts as the base frame of the library 10. Moreover, the storage frame 11 illustrated in FIG. 2 is contemplated to be a minimum configuration of the library 10, for which there is only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front wall 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. In a preferred approach, the multi-cartridge deep slot cells may be arranged in sequential order of tiers from front to rear (e.g., see FIG. 7A).

With continued reference to FIG. 2, the storage frame 11 of the library 10 also includes at least one data storage drive 15, e.g., for reading and/or writing data with respect to the data storage media. Additionally, a first accessor 18 may be used to transport data storage media between the plurality of storage slots 16, the multi-cartridge deep slot cells, and/or the data storage drive(s) 15. According to various approaches, the data storage drives 15 may be optical disk drives, magnetic tape drives, or other types of data storage drives as are used to read and/or write data with respect to the data storage media.

As illustrated, the storage frame 11 may optionally include an operator panel or other user interface, such as a web-based interface, which allows a user to interact with the library 10. The storage frame 11 may also optionally comprise an upper I/O station 24 and/or a lower I/O station 25, thereby allowing data storage cartridges to be added (e.g., inserted) to the library inventory and/or removed from the library without disrupting library operation. Furthermore, the library 10 may have one or more storage frames 11, each having storage slots 16, preferably accessible by the first accessor 18.

As described above, the storage frames 11 may be configured with different components depending upon the intended function. One configuration of storage frame 11 may comprise storage slots 16 and/or multi-cartridge deep slot cells 100, data storage drive(s) 15, and other optional components to store and retrieve data from the data storage cartridges. However, in another approach, a storage frame 11 may include storage slots 16 and/or multi-cartridge deep slot cells 100 and no other components. The first accessor 18 may have a gripper assembly 20, e.g., for gripping one or more data storage media, in addition to having a bar code scanner or other reading system, such as a cartridge memory reader or similar system mounted on the gripper assembly 20, to "read" identifying information about the data storage media.

Figure 3:
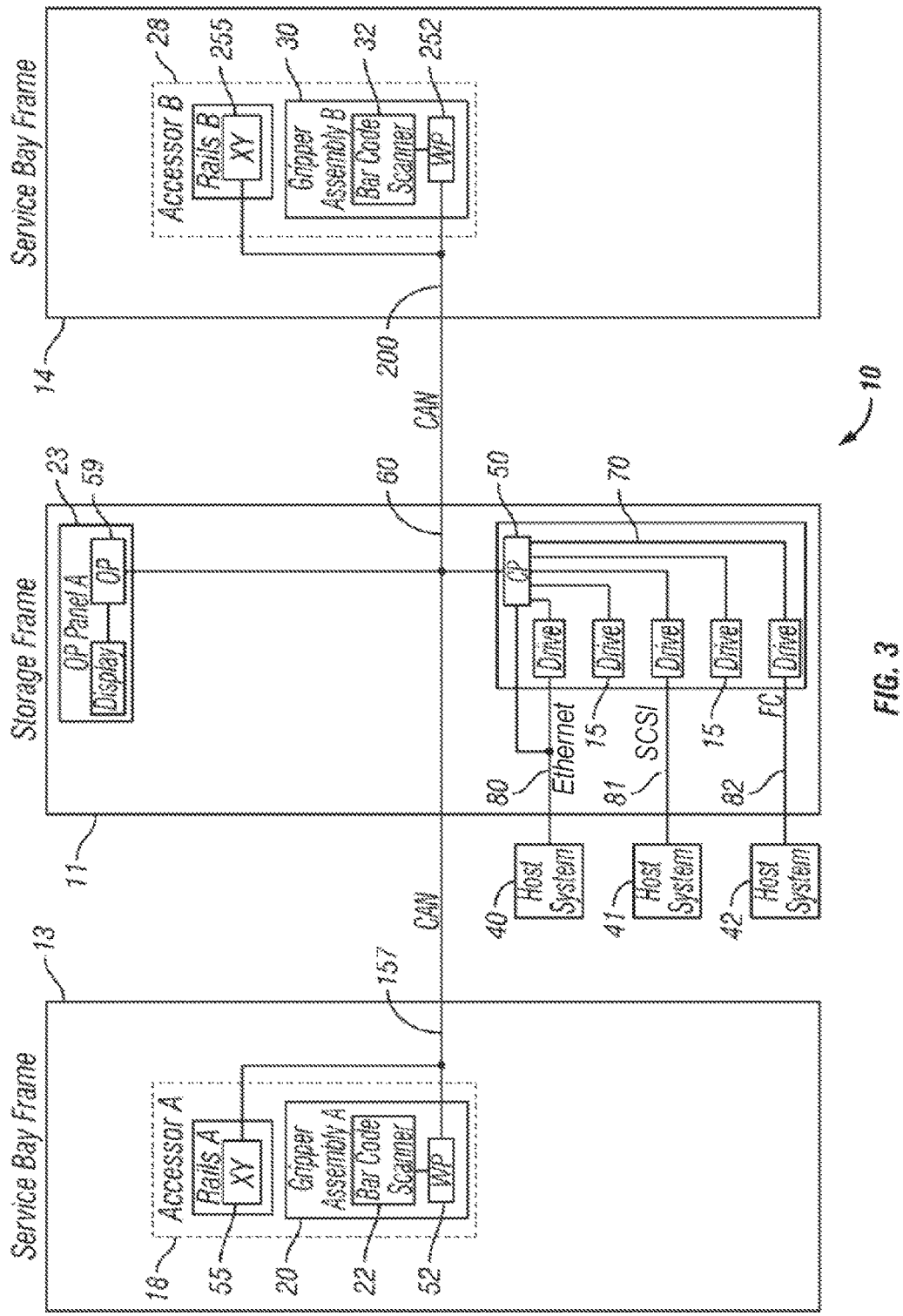
FIG. 3 is a block diagram of an automated data storage library according to one embodiment.

FIG. 3 depicts an automated data storage library 10, in accordance with one embodiment. As an option, the present automated data storage library 10 may be implemented in conjunction with features from any other embodiment listed herein, such as those described with reference to the other FIGS. Of course, however, such automated data storage library 10 and others presented herein may be used in various applications and/or in permutations which may or may not be specifically described in the illustrative embodiments listed herein. Further, the automated data storage library 10 presented herein may be used in any desired environment. Thus FIG. 3 (and the other FIGS.) should be deemed to include any and all possible permutations Referring now to FIG. 3, the automated data storage library 10 as described in reference to FIGS. 1 and 2, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

Referring still to FIG. 3, the library 10 may have one or more storage frames 11, a left hand service bay 13 and a right hand service bay 14. The left hand service bay 13 is shown with a first accessor 18, where, as discussed above, the first accessor 18 may include a gripper assembly 20 and/or a bar code scanner (e.g., reading system) to "read" identifying information about the data storage media depending on the desired embodiment. Furthermore, the right hand service bay 14 is shown having a second accessor 28, which includes a gripper assembly 30 and may also include a reading system 32 to "read" identifying information about the data storage media.

According to one approach, in the event of a failure or other unavailability of the first accessor 18, or its gripper assembly 20, etc., the second accessor 28 may perform some or all of the functions of the first accessor 18. Thus in different approaches, the two accessors 18, 28 may share one or more mechanical paths, they may have completely independent mechanical paths, or combinations thereof. In one example, the accessors 18, 28 may have a common horizontal rail with independent vertical rails to travel therealong. Moreover, it should be noted that the first and second accessors 18, 28 are described as first and second for descriptive purposes only and this description is not meant to limit either accessor to an association with either the left hand service bay 13, or the right hand service bay 14.

In an exemplary embodiment which is in no way intended to limit the invention, the first and second accessors 18, 28 may preferably move their grippers in at least two directions, called the horizontal "X" direction and vertical "Y" direction, e.g., to retrieve and grip, deliver and release, load and unload, etc. the data storage cartridge at the storage slots 16, multi-cartridge deep slot cells 100, data storage drives 15, etc.

With continued reference to FIG. 3, library 10 receives commands from one or more host systems 40, 41, 42. The host systems 40, 41, 42, such as host servers, communicate with the library directly, e.g., on line 80 (e.g., path), through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16 and the data storage drives 15. The commands are typically logical commands identifying the cartridges or cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessor 18, 28. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

Still referring to FIG. 3, the communication processor node 50 may additionally provide a line 70 for communicating with the data storage drives 15, e.g., a communication link. As illustrated, the communication processor node 50 may preferably be located in the storage frame 11, e.g., close to the data storage drives 15. Furthermore, one or more additional work processor nodes may be provided to form an exemplary distributed processor system, which may comprise, e.g., a work processor node 52 located at first accessor 18, and that is coupled to the communication processor node 50 via a network 60, 157. According to different approaches, each work processor node may respond to received commands that are broadcast thereto from any communication processor node, and the work processor nodes may also direct the operation of the accessors, e.g., providing move commands. An XY processor node 55 may be provided and may be located at an XY system of first accessor 18. As illustrated, the XY processor node 55 is coupled to the network 60, 157, and is responsive to the move commands, operating the XY system to position the gripper assembly 20.

Also, an operator panel processor node 59 may be provided at the optional operator panel for providing an interface for communicating between the operator panel and the communication processor node 50, the work processor nodes 52, 252, and the XY processor nodes 55, 255.

A network 60, for example comprising a common bus, is provided, coupling the various processor nodes. The network may comprise a robust wiring network, such as the commercially available Controller Area Network (CAN) bus system, which is a multi-drop network, having a standard access protocol and wiring standards, for example, as defined by CiA, the CAN in Automation Association, Am Weich Selgarten 26, D-91058 Erlangen, Germany. Other networks, such as Ethernet, or a wireless network system, such as RF or infrared, may be employed in the library as is known to those of skill in the art. In addition, multiple independent networks may also be used to couple the various processor nodes.

As illustrated in FIG. 3, the communication processor node 50 is coupled to each of the data storage drives 15 of a storage frame 11, via lines 70, and are thereby communicating with the drives 15 and with host systems 40, 41, 42. Alternatively, the host systems 40, 41, 42 may be directly coupled to the communication processor node 50, at line 80 (e.g., input) for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, lines 80 and 81 are intended to be Ethernet and a SCSI bus, respectively, e.g., and may serve as host connections. However, path 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various approaches, any of the additional storage frames 11 may include communication processor nodes 50, storage slots 16, data storage drives 15, networks 60, etc.

Moreover, as described above, the automated data storage library 10 may comprise a plurality of accessors. A second accessor 28, for example, is shown in a right hand service bay 14 of FIG. 3. The second accessor 28 may include a gripper assembly 30 for accessing the data storage media, and an XY system 255 for moving the second accessor 28. The second accessor 28 may run on the same horizontal mechanical path as the first accessor 18, and/or on an adjacent (e.g., separate) path. Moreover the illustrative control system additionally includes an extension network 200 which forms a network coupled to network 60 of the storage frame(s) 11 and to network 157 of left hand service bay 13.

In FIG. 3 and the accompanying description, the first and second accessors are associated with the left hand service bay 13 and the right hand service bay 14 respectively. However, this is for illustrative purposes and there may not be an actual association. Thus, according to another approach, network 157 may not be associated with the left hand service bay 13 and network 200 may not be associated with the right hand service bay 14. Moreover, depending on the design of the library, it may not be necessary to have a left hand service bay 13 and/or a right hand service bay 14 at all.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 4:
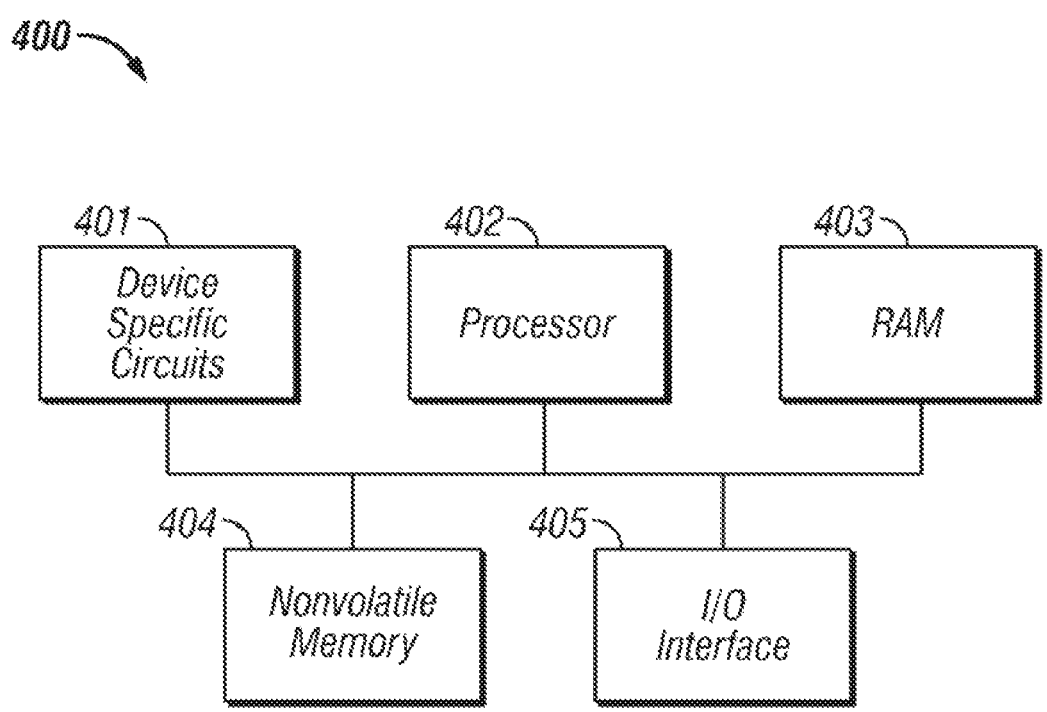
FIG. 4 is a block diagram depicting a controller configuration according to one embodiment.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data. Moreover, the I/O interface 405 comprises a communication interface that allows the processor 402 to communicate with devices external to the controller. Examples may comprise, but are not limited to, serial interfaces such as RS-232, USB (Universal Serial Bus) or Small Computer Systems Interface (SCSI). The device specific circuits 401 provide additional hardware to enable the controller 400 to perform unique functions including, but not limited to, motor control of a cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers.

Figure 5A:
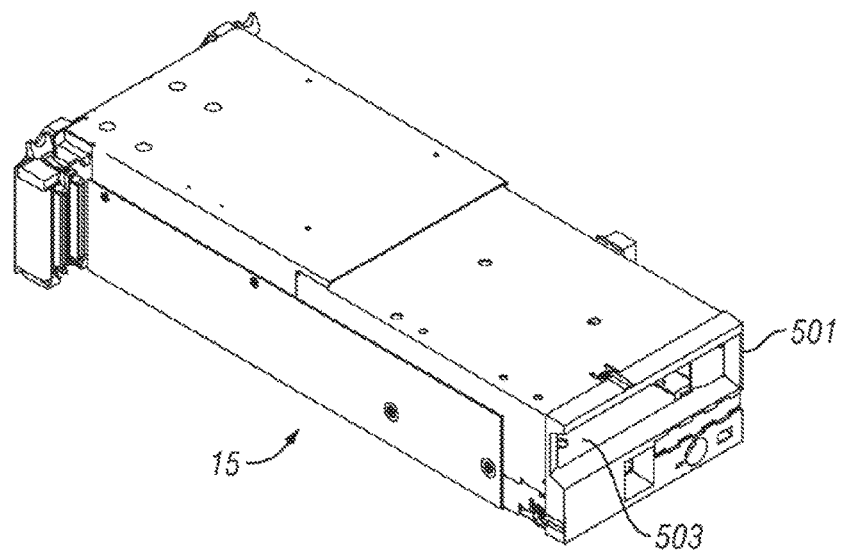
FIG. 5A is a front perspective view of a data storage drive according to one embodiment.
Figure 5B:
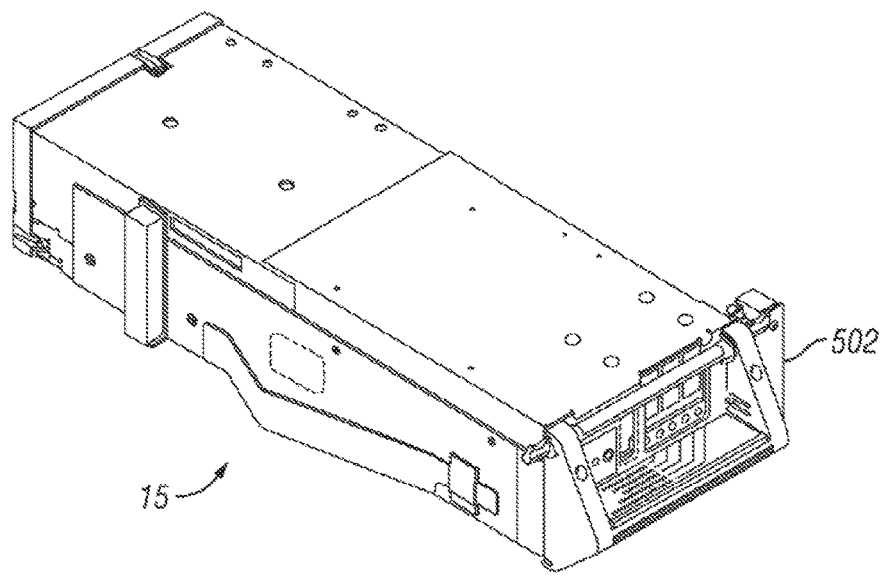
FIG. 5B is a rear perspective view of the data storage drive of FIG. 5A.

FIGS. 5A-5B illustrate the front 501 and rear 502 views of a data storage drive 15, according to one embodiment. In the example depicted in FIGS. 5A-5B, the data storage drive 15 comprises a hot-swap drive canister, which is in no way intended to limit the invention. In fact, any configuration of data storage drive may be used whether or not it includes a hot-swap canister. As discussed above, a data storage drive 15 is used to read and/or write data with respect to the data storage media, and may additionally communicate with a memory which is separate from the media, and is located within the cartridge. Thus, according to one approach, a data storage cartridge may be placed into the data storage drive 15 at opening 503.

Figure 6:
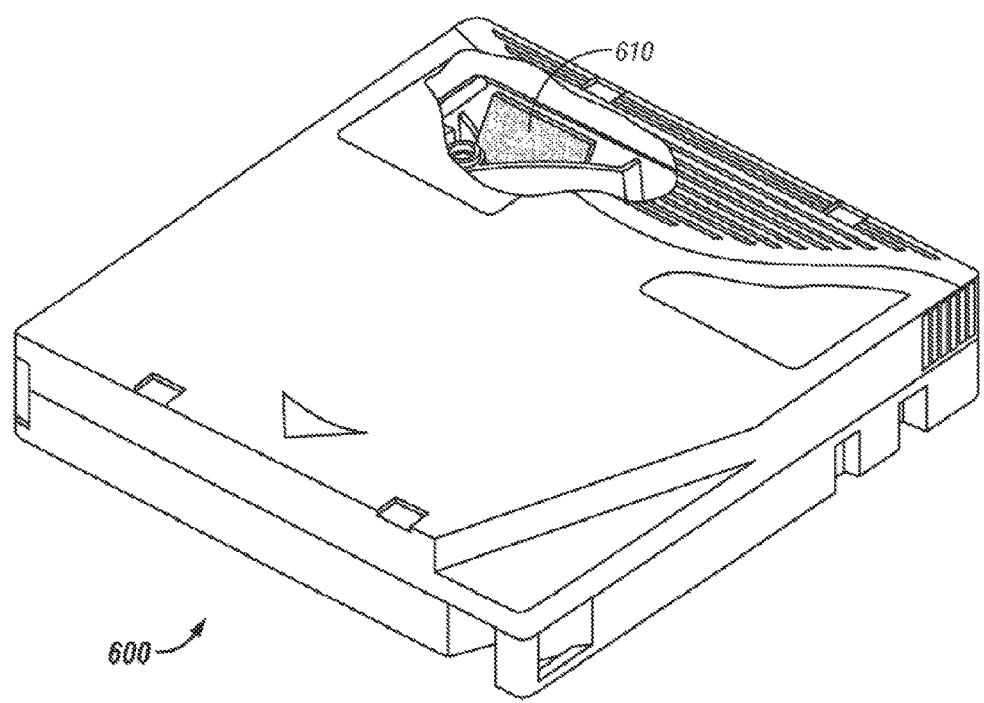
FIG. 6 is perspective view of a data storage cartridge having a cutaway portion, according to one embodiment.

Furthermore, FIG. 6 illustrates an embodiment of a data storage cartridge 600 with a cartridge memory 610 shown in a cutaway portion of the Figure, which is in no way intended to limit the invention. In fact, any configuration of data storage cartridge may be used whether or not it comprises a cartridge memory. According to various approaches, media of the data storage cartridge media may include any type of media on which data may be stored, including but not limited to magnetic media, e.g., magnetic tape, disks, etc.; optical media, e.g., optical tape, disks, etc.; electronic media, e.g., PROM, EEPROM, flash PROM, CompactFlash™, Smartmedia™, Memory Stick™, etc.; etc., or other suitable media. Moreover, an example of a data storage cartridge that is widely employed in automated data storage libraries for mass data storage is a magnetic tape cartridge in which the media is magnetic tape.

Figure 7A:
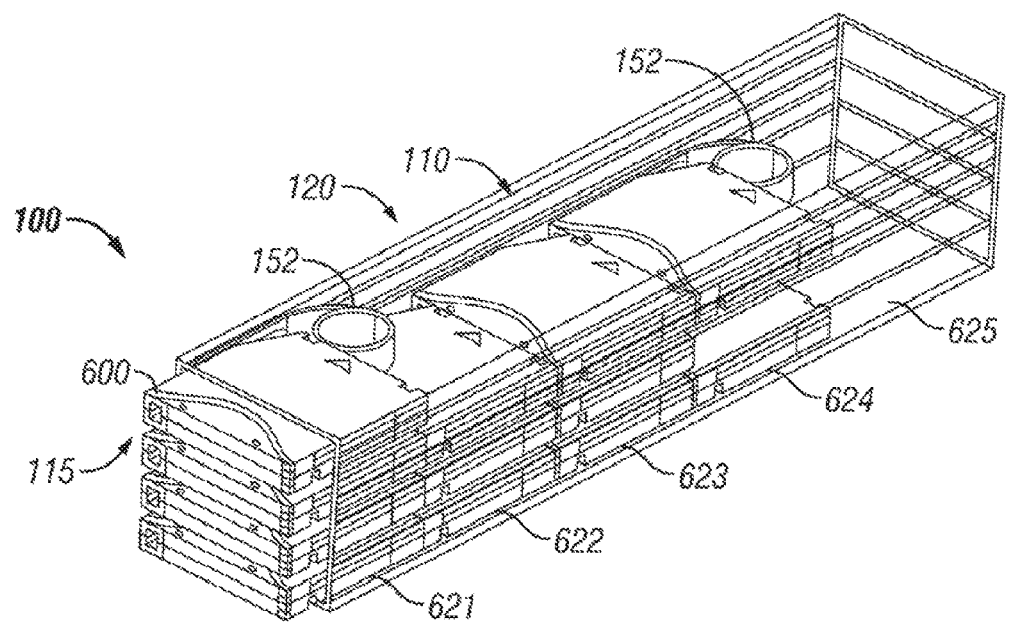
FIGS. 7A-7B are perspective views of a multi-cartridge deep slot cell according to one embodiment.
Figure 7B:
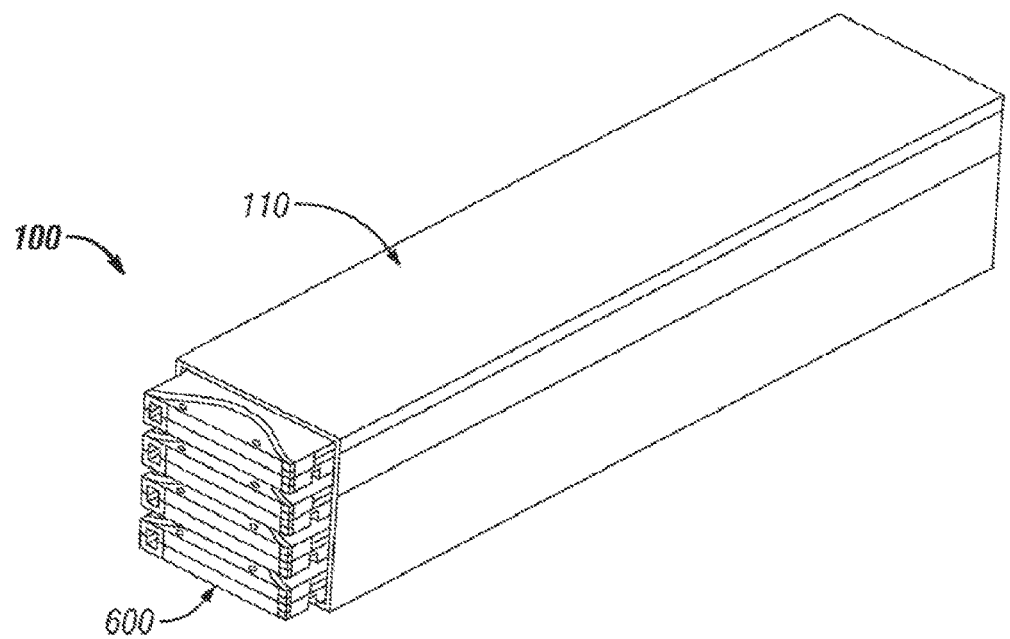

Looking now to FIGS. 7A-7B, a multi-cartridge deep slot cell 100 having biasing springs 152 is depicted according to one embodiment. As shown in the illustrative embodiment, the multi-cartridge deep slot cell 100 comprises a housing 110 defining an interior space 115. Furthermore, a plurality of storage slots 120 is disposed within the housing, and may be configured for storing up to a plurality of data storage cartridges 600, depending on the desired approach. Alternatively, the multi-cartridge deep slot cell 100 may be built into the frame of the automated data storage library according to one approach.

FIGS. 8A-8D illustrate an embodiment of a cartridge blocking mechanism 150 having a retaining gate 660 that retains the data storage cartridges in the multi-cartridge deep slot cell 100 according to one embodiment. As illustrated, according to one approach, the retaining gate 660 may be externally attached to a multi-cartridge deep slot cell 100, relative to a front opening of the multi-cartridge deep slot cell 100, whereby the retaining gate 660 can be activated by an accessor 18, e.g., of an automated tape library. Moreover, the retaining gate 660 allows for positive cartridge retention against the pressure of biasing springs (see 152 of FIGS. 7A-7B), and ensures that one or more data storage cartridges do not get pushed out of the multi-cartridge deep slot cell 100 simultaneously, while allowing the pushing mechanism (not shown) of the multi-cartridge deep slot cell 100 to continuously push data storage cartridge(s) to the opening in a multi-cartridge deep slot cell 100. Thus, according to one approach, the accessor 18 may open the retaining gate to gain access to the data storage cartridge in tier 1 and, upon its extraction, the biasing spring 152 moves the cartridge(s) positioned behind the extracted cartridge forward, thereby promoting the cartridge(s) by one tier as will soon become apparent.

The basic working of the retaining gate is that the gate prevents the data storage cartridge(s) from being pushed out of a multi-cartridge deep slot cell 100. For example, as shown in FIGS. 8A-8D, a retaining gate 660 can be lifted by, for example, accessor 18 or by a front storage cartridge 642 for cartridge removal from/insertion into a multi-cartridge deep slot cell 100. Specifically, retaining gate 660 has a pivoting arm 661 mounted on multi-cartridge deep slot cell 100 via a pivoting post (not shown) that can be integral to a construction of multi-cartridge deep slot cell 100. Pivoting arm 661 is located below a catch 662 of retaining gate 660 whereby a thrust force TF through data storage cartridge 644-642 caused by the pushing mechanism (not shown) of multi-cartridge deep slot cell 100 causes retaining gate 660 to stay closed in a retaining position as shown in FIG. 8A. Moreover, the retaining gate 660 is preferably biased such that it closes in the downward direction over the front opening of multi-cartridge deep slot cell 100. This constant biasing may be achieved via gravity as shown in FIG. 8A or by implementing a spring force, e.g., attached to retaining gate 660 (not shown).

For removal of front storage cartridge 642 by accessor 18 from multi-cartridge deep slot cell 100, retaining gate 660 must be lifted upward to a releasing position whereby catch 662 of retaining gate 660 is disengaged from front storage cartridge 642. This can be seen in FIG. 8B where accessor 18 interfaces with retaining gate 660 by providing a lifting force. Once retaining gate 660 is lifted to the releasing position and accessor 18 is engaged with storage cartridge 642, accessor 18 can pull storage cartridge 642 out of multi-cartridge deep slot cell 100 and into accessor 18 without any interference of retaining gate 660 as shown in FIG. 8C. In view of storage cartridges 644 and 643 being stored in multi-cartridge deep slot cell 100, retaining gate 660 must return to its retaining position to prevent storage cartridges 644 and 643 from being ejected from multi-cartridge deep slot cell 100 by the thrust force TF of the pushing mechanism (not shown). During extraction of front storage cartridge 642 through the front opening of multi-cartridge deep slot cell 100, the retaining gate 660, which is being biased downward, moves back to the retaining position to engage storage cartridge 643.

Once front storage cartridge 642 is extracted and storage cartridges 643 and 644 are retained from being pushed out of multi-cartridge deep slot cell 100, retaining gate 660 has successfully completed its cartridge retrieval process. Now retaining gate 660 demonstrates its ability to work for cartridge insertion into multi-cartridge deep slot cell 100. When accessor 18 begins to insert storage cartridge 642 back into multi-cartridge deep slot cell 100, retaining gate 660 is lifted to its releasing position to allow storage cartridge 642 through the front opening of multi-cartridge deep slot cell 100. Catch 662 of retaining gate 660 interfaces with a rear portion of storage cartridge 642, in particular a beveled surface of catch 662 as shown in FIG. 8D, whereby retaining gate 660 is lifted to its releasing position as shown in FIG. 8B due to storage cartridge 642 being pushed in multi-cartridge deep slot cell 100 by accessor 18. In doing so, storage cartridges 644, 643 are pushed deeper into multi-cartridge deep slot cell 100 by storage cartridge 642 in multi-cartridge deep slot cell 100 by accessor 18. Thus, the accessor is able to provide a force greater than the thrust force TF antiparallel thereto, to overcome the directional biasing of the storage cartridges 644, 643. Upon full insertion into multi-cartridge deep slot cell 100, retaining gate 660 moves to its retaining position to engage storage cartridge 642 as shown in FIG. 8A.

Thus, looking to various embodiments presented herein, access to a storage slot may include the ability to remove a cartridge from a storage slot, the ability to place a cartridge into a storage slot, or combinations thereof.

According to an exemplary embodiment, the storage slots from top to bottom are considered to be in parallel and comprise the same tier. Moreover, the storage slots from front to back, in a particular row, are considered to be in series and comprise sequential tiers.

Referring back to FIGS. 7A-7B, in accordance with one embodiment, storage slots 120 are depicted as being configured for storing up to a plurality of data storage cartridges 600, and arranged in sequential order of tiers 621, 622, 623, 624, 625 from front to rear. It should be noted that the front-most tier 621 is also called "tier 1", while the next tier 622 is called "tier 2", etc., and the last tier 625 is also called the "rearmost" tier. However, referring to FIG. 2, in one embodiment, the single cartridge storage slots 16 are also termed "tier 0".

Referring again to FIGS. 1-3, according to one embodiment, the controller of automated data storage library 10 may operate the accessor(s) 18, 28 to selectively extract, place and/or transport data storage cartridges with respect to the multi-cartridge deep slot cells 100 and/or other elements of the automated data storage library 10. For example, the controller may facilitate extracting a cartridge from a multi-cartridge deep slot cell 100, transporting the cartridge to a data storage drive 15 and placing the cartridge in the drive 15. The controller may then extract the cartridge from the data storage drive 15, while directing the accessor to transport the cartridge to a specific multi-cartridge deep slot cell 100, and place the cartridge therein.

In one embodiment, one or more data storage cartridges may be added into the library, e.g., at an I/O station 24, 25, whereby the controller of the automated data storage library 10 may then operate the accessor(s) 18, 28 to transport the cartridge(s) to specific multi-cartridge deep slot cell(s) 100, and place the cartridge(s) therein. Similarly, the controller may operate the accessor(s) to selectively extract, place and transport data storage cartridges with respect to the single cartridge storage slots 16, and/or transport inserted or added cartridge(s) to specific single cartridge storage slots 16.

Figure 9:
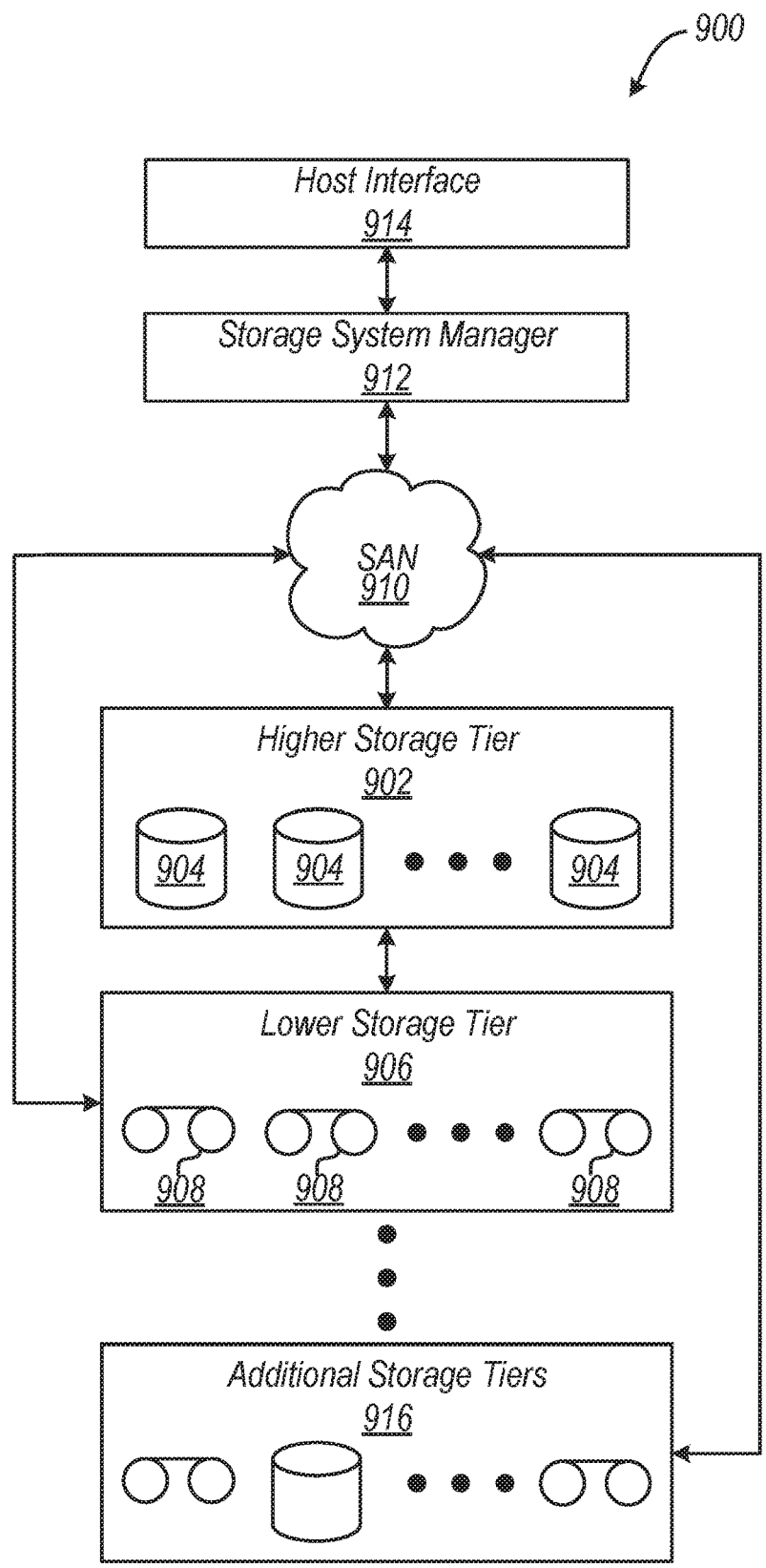
FIG. 9 is a tiered data storage system, in accordance with one embodiment.

Now referring to FIG. 9, a storage system 900 is shown according to one embodiment. Note that some of the elements shown in FIG. 9 may be implemented as hardware and/or software, according to various embodiments. In some approaches, the storage system 900 may be implemented in an automated data storage library such as that shown in FIGS. 1-2. In other approaches, an automated data storage library such as that shown in FIGS. 1-2 may be a tier of the storage system 900.

The storage system 900 may include a storage system manager 912 for communicating with a plurality of media on at least one higher storage tier 902 and at least one lower storage tier 906. The higher storage tier(s) 902 preferably may include one or more random access and/or direct access media 904, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 906 may preferably include one or more lower performing storage media 908, including sequential access media such as magnetic tape in tape drives and/or optical media, slower accessing HDDs, slower accessing SSDs, etc., and/or others noted herein or known in the art. One or more additional storage tiers 916 may include any combination of storage memory media as desired by a designer of the system 900. Also, any of the higher storage tiers 902 and/or the lower storage tiers 906 may include some combination of storage devices and/or storage media.

The storage system manager 912 may communicate with the storage media 904, 908 on the higher storage tier(s) 902 and lower storage tier(s) 906 through a network 910, such as a storage area network (SAN), as shown in FIG. 9, or some other suitable network type. The storage system manager 912 may also communicate with one or more host systems (not shown) through a host interface 914, which may or may not be a part of the storage system manager 912. The storage system manager 912 and/or any other component of the storage system 900 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 900 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 902, may include a majority of SSD storage media for storing data in a higher performing storage environment, and remaining storage tiers, including lower storage tier 906 and additional storage tiers 916 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 902, while data not having one of these attributes may be stored to the additional storage tiers 916, including lower storage tier 906. Of course, one of skill in the art, upon reading the present descriptions, may devise many other combinations of storage media types to implement into different storage schemes, according to the embodiments presented herein.

According to some embodiments, the storage system (such as 900) may include logic configured to receive a request to open a data set, logic configured to determine if the requested data set is stored to a lower storage tier 906 of a tiered data storage system 900 in multiple associated portions, logic configured to move each associated portion of the requested data set to a higher storage tier 902 of the tiered data storage system 900, and logic configured to assemble the requested data set on the higher storage tier 902 of the tiered data storage system 900 from the associated portions. Of course, this logic may be implemented as a method on any device and/or system or as a computer program product, according to various embodiments.

As previously mentioned, efforts to improve the performance of traditional data centers attempt to minimize the cost of processing and storing data. However, previous attempts have been unsuccessful. For instance, reducing operational costs of datacenters by running the equipment in the datacenter at the upper end of its environmental operational limits to reduce temperature and/or humidity regulation costs is not desirable in magnetic tape libraries, as magnetic tape is highly susceptible to degradation as a result.

Rather, in order to effectively operate a tape library in a datacenter at its relatively lower operational limits, the entire datacenter is conventionally cooled to the operational limits of magnetic tape. However, this is expensive to maintain and becomes cost prohibitive, particularly in the cloud computing model. Attempts to create a cooler separate room inside a datacenter may be effective over time, but impose significant up-front cost to build, and are not flexible for future growth of the datacenter.

In sharp contrast, various embodiments described herein include automated tape libraries which are able to provide their own integrated cooling system that allows a library to operate in a less favorable (e.g., hotter and/or more humid) datacenter environment while keeping the tape media and tape drives within the library at a more desirable (e.g., cooler and/or less humid) operating environment. Accordingly, some of the embodiments included herein may be able to improve the operating efficiency of datacenters and thereby overcome the aforementioned shortcomings experienced by existing systems.

Figure 10:
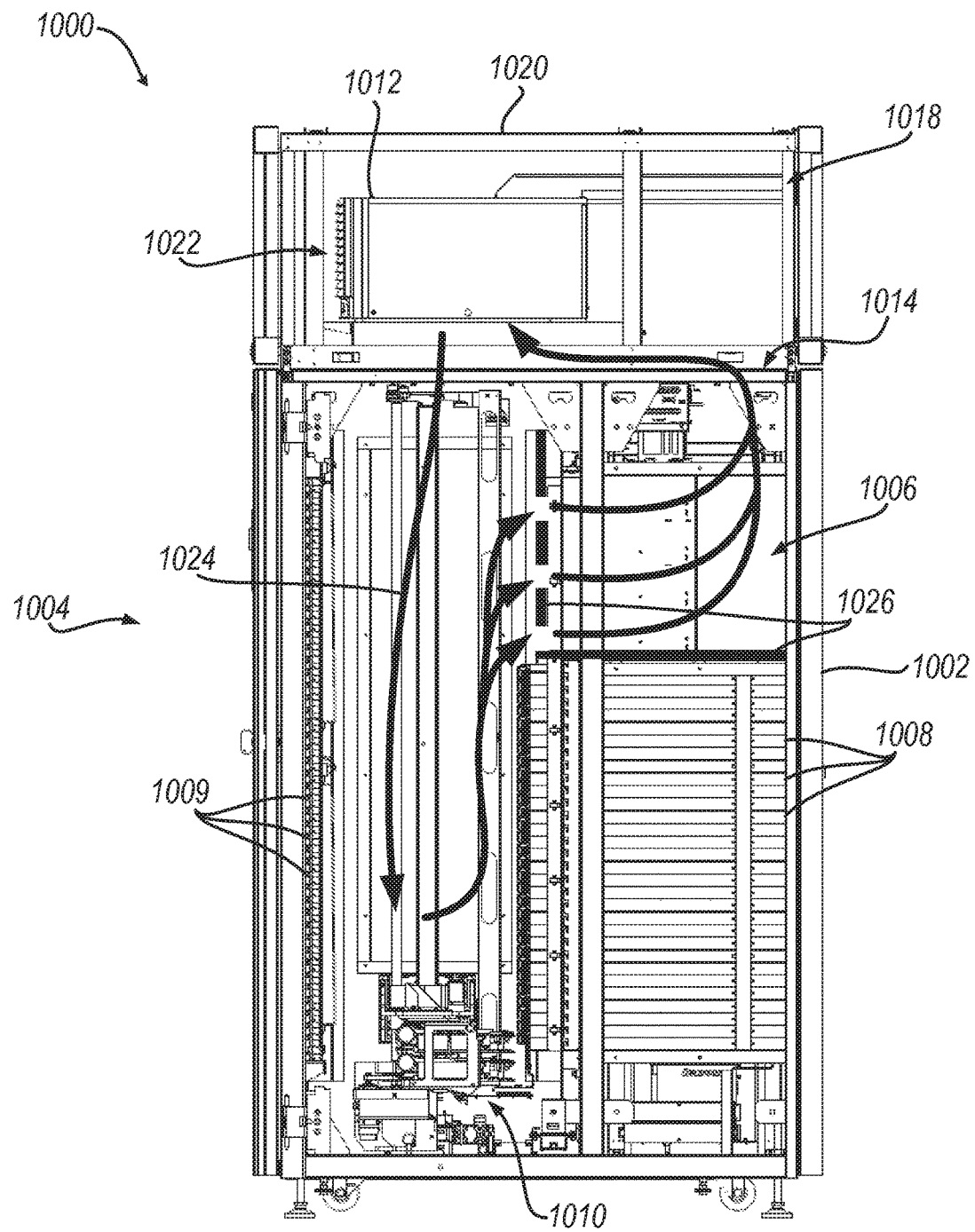
FIG. 10 is a partial side view of a system for storing magnetic recording media, in accordance with one embodiment.

Looking to FIG. 10, a system 1000 is shown in accordance with one embodiment. As an option, the present system 1000 may be implemented in conjunction with features from any other embodiment listed herein, such as those described with reference to the other FIGS., such as FIG. 1. However, such system 1000 and others presented herein may be used in various applications and/or in permutations which may or may not be specifically described in the illustrative embodiments listed herein. Further, the system 1000 presented herein may be used in any desired environment. Thus FIG. 10 (and the other FIGS.) may be deemed to include any possible permutation.

As shown, system 1000 includes a frame 1002 of an automated tape library 1004. As described above, automated tape libraries are typically used to store tape cartridges and tape drives in large arrays to store large amounts of data. Thus, an interior of frame 1002 is illustrated in the present embodiment as including one or more tape drives 1006, an area for storing tape cartridges (e.g., multi-cartridge deep slot cells 1008 and single cartridge storage slots 1009), and a robotic accessor 1010, among other components which would be apparent to one skilled in the art upon reading the present description (e.g., see FIG. 2 above).

However, typical automated tape libraries have traditionally operated in environments having ideal temperature and humidity levels within the operational specifications of the tape media and tape drives. As such, automated tape libraries have previously relied on outside air to flow through the library to keep the tape drives and tape media cool as the tape drives heat the air during the process of normal operation (e.g., such as reading and writing data to tape media). However, as mentioned above, this limits the number of environments an automated tape library can be implemented in. If the air outside the library is not cool or dry enough, exposing the interior of the library thereto is harmful to the tape media and/or the tape drives.

In sharp contrast, system 1000 of FIG. 10 further includes an air conditioning unit 1012 coupled to the frame 1002. The air conditioning unit 1012 is preferably coupled to an upper surface 1014 (e.g., the roof) of the frame 1002 as shown. This allows for the air conditioning unit 1012 to operate without negatively affecting the operating conditions in the frame 1002. Different components of the air conditioning unit 1012, e.g., such as the condenser coils, heat up significantly during use and would raise at least the temperature inside the frame 1002, thereby decreasing efficiency of the system 1000. Alternatively, by coupling the air conditioning unit 1012 to the exterior surface of the frame 1002, ambient air may be passed over condenser coils of the air conditioning unit 1012 without entering the interior of the frame 1002, thereby keeping it cool and preventing overheating of the air conditioning unit 1012. Moreover, by coupling the air conditioning unit 1012 to an upper surface 1014 of the frame 1002, it may easily be removed and/or reattached, e.g., depending on the desired embodiment. For example, an air conditioning unit may be implemented with an automated tape library which was determined to be operating at an undesirably high internal temperature by being coupled the air conditioning unit to the upper surface of the frame of the tape library. Datacenters in which system 1000 may be implemented also typically have high ceilings above the equipment where the air conditioning units may be installed without implementing any additional floor space in order to achieve the functionality of integrated cooling. Mounting air conditioning units to the upper surface (top) of the frame 1002 also allows for multiple air conditioners to be installed with multiple frames in a given embodiment. As a result, an air conditioning capacity may be scaled appropriately with the size of the tape library and the internal loads within the tape library, as will be described in further detail below. However, an air conditioning unit may be functionally coupled the frame 1002 by positioning the air conditioning unit elsewhere and using ducts to route the air to the interior of the frame 1002, coupling the air conditioning unit to a side of the frame 1002, coupling the air conditioning unit to a bottom of the frame 1002 (underneath the frame 1002), etc., depending on the desired approach.

The air conditioning unit 1012 is preferably configured such that it may regulate the relative conditions (e.g., temperature, humidity, contaminant presence via filtering, etc.) inside the frame 1002. Thus, according to different approaches, the air conditioning unit may be able to reduce an ambient temperature of (cool) the interior of the frame 1002 and/or reduce the relative humidity of the interior of the frame 1002, e.g., depending on the type of air conditioning unit 1012.

The air conditioning unit 1012 is preferably configured to turn on and off as desired to maintain a selected temperature in the interior of the frame 1002. Alternatively, the air conditioner fan can be left always on to keep air circulating within the interior of the frame, and the condenser turns on and off to maintain a selected temperature in the interior of the frame 1002.

According to preferred embodiments, the air conditioning unit 1012 may further or alternatively be configured to have a scalable cooling capacity, whereby the cooling effect may be adjusted depending on the desired conditions of the interior and/or exterior of the frame 1002. As used herein, a scalable cooling capacity may include the ability to adjust a temperature, humidity, continuous flow rate, compressor speed, etc., of the conditioned air output from the air conditioning unit 1012 itself. For example, a temperature of the conditioned air output from the air conditioning unit 1012 to the interior of frame 1002 may be raised or lowered depending on how high or low the temperature is inside the frame 1002. Furthermore, in some approaches, a scalable cooling capacity may include the ability to selectively activate and/or deactivate select air conditioning units for tape libraries having multiple frames and air conditioning units which are able to adjust the interior conditions of the same (overlapping) frames, e.g., as will be described in further detail below.

Adjustments made to the scalable cooling capacity of the air conditioning unit 1012 may be based on operating conditions, e.g., such as heat loads inside the tape library frame generated by the tape drives 1006, heat loads outside of the tape library frame generated by other libraries (e.g., tape libraries, disk libraries, etc.), a number of operations performed by the system, a number of tape library frames included in a given system, etc. Moreover, operating conditions may be determined using readings from sensors positioned in the system, overall throughput of the system, user input, etc. Adjustments to the scalable cooling capacity of the air conditioning unit 1012 may be made each period of a sampling rate for the sensors positioned in the system, when an operating condition exceeds a threshold (or equivalently is within a range, is outside a range, etc.), upon user request, in response to real-time calculations, etc. It follows that the air conditioning unit 1012 may be connected to a network (e.g., wireless, wired, etc.), thereby allowing for remote monitoring and/or control.

According to an exemplary embodiment, which is in no way intended to limit the invention, a desired temperature range for the interior of a tape library frame used for operational storage may be between about 61 degrees Fahrenheit and about 90 degrees Fahrenheit, but could be higher or lower depending on the desired embodiment. Moreover, a desired temperature range for the interior of a tape library frame used for archival storage may be between about 61 degrees Fahrenheit and about 77 degrees Fahrenheit, but could be higher or lower depending on the desired embodiment. According to another exemplary embodiment, which is in no way intended to limit the invention, a desired humidity range for the interior of a tape library frame may be between about 20% and about 50% relative humidity, but could be higher or lower depending on the desired embodiment. It follows that any of the aforementioned ranges may be used to regulate the internal operating conditions of the frame 1002 in FIG. 10. For example, when a controller coupled to a temperature sensor positioned inside the frame 1002 detects that the average temperature inside the frame 1002 has risen above 90 degrees Fahrenheit for a tape library frame used for operational storage, the air conditioning unit 1012 may automatically be turned on to lower the internal temperature of the frame 1002.

As would be appreciated by one skilled in the art, the air conditioning unit 1012 may be able to adjust the relative temperature and/or humidity of the interior of the frame 1002 in a conventional manner. Cold air may flow into the interior of the frame 1002 via an inlet air duct which may connect the air conditioning unit 1012 to the interior of the frame 1002, thereby forming an inlet in the upper surface of the frame 1002. Specifically, an inlet air duct may direct the air cooled by the air conditioning unit 1012 into the interior of the frame 1002, e.g., where the majority of the tape media may be stored. As a result, air flow is created from the air conditioning unit 1012 to the interior of the frame 1002, e.g., as indicated by arrows 1024. This air flow may be induced by a fan included in the air conditioning unit 1012 and/or by using the fans in the one or more tape drives 1006, as will be described in further detail below.

Once in the interior of the frame 1002, the air flow may extend past the multi-cartridge deep slot cells 1008 and single cartridge storage slots 1009, eventually being carried past and/or through the one or more tape drives 1006. Thus, the air being cycled through the air conditioning unit transfers heat from interior of the frame 1002 and the tape drives 1006. A baffle or baffles 1026 are preferably configured to isolate hot air produced by (e.g., exiting) the tape drives 1006 from the area for storing tape cartridges. In other words, a baffle or baffles 1026 are preferably configured to create hot and cold air separation in the interior of the frame 1002. As mentioned above, magnetic tape and other magnetic media degrade when exposed to undesirable (e.g., hot, humid, etc.) conditions. Thus, it is preferred to prevent the heat produced by the tape drives 1006 from returning to the area for storing tape cartridges, as will be described in further detail below.

The air flow is preferably directed through the gaps in the vertical baffle, thereby causing the conditioned air to flow through each of the tape drives 1006. The gaps in the vertical baffle may also be used by the robotic accessor 1010 to provide tape cartridges to the tape drives 1006. Moreover, the horizontal baffle is preferably used to prevent air from flowing to the multi-cartridge deep slot cells 1008 once passed through the tape drives 1006. The air exiting the tape drives is hot (e.g., at least hotter than when it left the air conditioning unit 1012), and would otherwise thereby cause magnetic tape exposed thereto to be negatively affected. Thus, air exiting the tape drives 1006 is preferably directed back to the air conditioning unit 1012 to be conditioned (cooled, dehumidified, filtered, etc.) for further use as would be appreciated by one skilled in the art upon reading the present description. Although the air flow is preferably directed from the air conditioning unit 1012 to the interior of the frame 1002, and from the interior of the frame 1002 back to the air conditioning unit 1012, the particular path that the air flow is shown as extending along in the present embodiment by arrows 1024 is in no way intended to limit the invention.

According to some approaches, the baffle or baffles 1026 may be configured to create hot and cold air separation, e.g., by keeping the air flow unidirectional. Moreover, in preferred approaches, one or more fans of the one or more tape drives 1006 in the frame 1002 are configured to generate the air flow circulating from the air conditioning unit 1012 to the interior of the frame 1002 and back to the air conditioning unit 1012. Thus, fans of one or more tape drives 1006 may be utilized to help create the aforementioned unidirectional air flow (e.g., loop) which may flow generally as shown by arrows 1024 in FIG. 10. According to one approach, the conditioned air (e.g., cool air) may be drawn into the frame 1002, and eventually passes through the tape drives 1006 themselves by operation of the fans within the tape drives 1006.

The one or more fans of the one or more tape drives 1006 in cooperation with the baffle(s) create a pressure differential on opposite sides of the tape drives 1006. This pressure differential induces the flow of air from the area for storing tape cartridges, through the tape drives 1006, and then back to the air conditioning unit 1012, rather than directly back into the interior of the frame 1002. If follows that the pressure differential created by the fans of the tape drives 1006 is preferably great enough to maintain unidirectional air flow from the area for storing tape cartridges, through the tape drives 1006 and back to the air conditioning unit 1012, but also low enough to avoid causing a significant amount of hot air exiting the back of the tape drives 1006 from being recirculated directly back into the area for storing tape cartridges. As a result, hot air is desirably not passed back into the area for storing tape cartridges or air conditioning unit 1012.

According to some approaches, fans of the one or more tape drives 1006 may be used in combination with other components used to create an air flow (e.g., air loop) from the air conditioning unit 1012, to the interior of the frame 1002 and back to the air conditioning unit 1012. According to one example, fans of one or more tape drives may be used in combination with fans of the air conditioning unit 1012 to generate the desired air flow.

However, in other approaches the fans of the one or more tape drives 1006 may be the only fans that generate the air flow within the interior of the first frame 1002. Accordingly, the air conditioning unit 1012 may not have a fan for circulating air out of the air conditioning unit 1012 into the interior of the frame 1002 and/or into the air conditioning unit 1012 from the interior of the frame 1002, in some approaches. However, the air conditioning unit 1012 may still have one or more fans which perform different functions, e.g., such as pulling ambient air from an inlet 1022, across the condenser coils, towards an exhaust port 1018, as will be described in further detail below.

The baffle or baffles 1026 may be formed using materials and/or processes which would be apparent to one skilled in the art for enabling an effective temperature separation. Thus, the baffle or baffles 1026 may be configured (e.g., designed) such that the air that is heated by the tape drives 1006 and other components is thermally isolated from the storage shelves of tape media. Creating hot and cold air separation for the system 1000 may desirably result in an efficient transfer of heat and/or humidity out of the interior of the frame 1002 (e.g., particularly the tape drives 1006), thereby making the storage conditions more favorable for magnetic tape media which may be stored in the multi-cartridge deep slot cells 1008 and/or single cartridge storage slots 1009. This may reduce absorption of moisture, which has been found to create tape dimensional instability; increase the expected media lifetime; reduce thermal degradation of the media; etc. However, it should be noted that the baffle or baffles 1026 may not be included in some approaches.

With continued reference to FIG. 10, system 1000 may include an enclosure 1020 for the air conditioning unit 1012. An additional fan may be included in the enclosure 1020 for passing ambient air over external components of the air conditioning unit 1012 to further promote cooling. Moreover, the enclosure 1020 may include an opening, a baffle or baffles, etc. to direct ambient air toward an inlet 1022 of the air conditioning unit 1012.

Any vents, voids, seams, etc. in the frame 1002 of the library 1004, other than an inlet and an outlet in an upper surface of the frame 1002, are preferably sealed such that air from outside the frame 1002 cannot reach the interior thereof. This may effectively seal the frame 1002 of the automated tape library 1004 such that the air flow circulating through the air conditioning unit 1012 is the only air moving into and out of the interior of the frame 1002. As a result, tape drives 1006, magnetic tape stored in the library 1004, etc., or other components in the frame 1002 may be isolated from the external environment and any unfavorable conditions which may be associated therewith. Moreover, this may allow for existing library frames to be repurposed and implemented in conjunction with some of the embodiments herein, as would become apparent after reading the present description. The frame 1002 may be sealed using any processes which would be apparent to one skilled in the art upon reading the present description, e.g., including but not limited to inserting foam, implementing insulating seals, etc. New frames may be built without any vents, voids, seams, etc.

Although the embodiment illustrated in FIG. 10 includes a single frame 1002 and a single air conditioning unit 1012, other embodiments may include additional frames and/or air conditioning units.

The ratio of automated tape library frames to air conditioning units may vary. According to some embodiments, more than one air conditioning unit may be included, e.g., depending on the number of automated tape library frames in a given system, the amount of heat and/or humidity produced by a given library, etc.

In some approaches, a single air conditioning unit may service more than one frame. Looking to FIG. 11, a system 1100 is illustrated in accordance with another embodiment, which includes four frames. As an option, the present system 1100 may be implemented in conjunction with features from any other embodiment listed herein, such as those described with reference to the other FIGS., such as FIG. 10. Accordingly, various components of FIG. 11 have common numbering with those of FIG. 10.

However, such system 1100 and others presented herein may be used in various applications and/or in permutations which may or may not be specifically described in the illustrative embodiments listed herein. Further, the system 1100 presented herein may be used in any desired environment. Thus FIG. 11 (and the other FIGS.) may be deemed to include any possible permutation.

As depicted, system 1100 includes an automated tape library 1102 with multiple frames 1104, 1106, 1108, 1110, while only a subset of these frames 1106, 1110 have an air conditioning unit coupled thereto. As described above, enclosures 1020 having air conditioning units therein are preferably mounted to an upper surface of the respective frames 1106, 1110 as shown in the present embodiment. Moreover, one or both of the air conditioning units may actively adjust the operating conditions for the interior of one of the frames, a subset of the frames, all of the frames, etc. According to one approach, one air conditioning unit may serve as a primary air conditioning unit which actively adjusts the operating conditions for the interior of all the frames 1104, 1106, 1108, 1110, while the other air conditioning unit is a redundant (e.g., backup) unit.

As shown, system 1100 includes an enclosure 1020, having a first air conditioning unit 1101 therein, coupled to an upper surface (top) of a first frame 1106 of an automated tape library 1102 and another enclosure 1020, having a second air conditioning unit 1103 therein, coupled to an upper surface (top) of a second frame 1110 of the tape library 1102. Drawing cutouts are shown on the enclosures 1020 to show the air conditioning units 1101, 1103 disposed therein. It should be noted that first and second air conditioning units 1101, 1103 may include any of the approaches described above with respect to air conditioning unit 1020 of FIG. 10.

Furthermore, an interior of the frames 1104, 1106, 1108, 1110 in system 1100 may include one or more tape drives, an area for storing tape cartridges (e.g., multi-cartridge deep slot cells and single cartridge storage slots), and a robotic accessor as described above with reference to FIG. 10, among other components which would be apparent to one skilled in the art upon reading the present description (e.g., see FIG. 2 above).

It should be noted that the left most frame 1104 may be a base frame in some approaches. Thus, frame 1104 may include an accessor which is able to access media and/or tape drives located in any one of the other frames 1106, 1108, 1110, e.g., using an accessor channel as described herein. Moreover, frame 1104 may not include an air conditioning unit directly coupled thereto. In other approaches, a frame may not include tape drives therein, e.g., and may be configured to only store magnetic media therein. Thus, in some approaches, an interior of the second frame preferably includes at least an area for storing tape cartridges and a second accessor channel. However it is preferred that a frame has at least some area for storing tape cartridges (e.g., multi-cartridge deep slot cells and/or single cartridge storage slots) therein.

Moreover, an accessor channel may extend between two or more of the frames 1104, 1106, 1108, 1110, thereby potentially allowing one robotic accessor to access any one of the frames 1104, 1106, 1108, 1110. The accessor channel may include tracks or similar components which enable the robotic accessor to travel between the frames 1104, 1106, 1108, 1110 and preferably access areas for storing tape cartridges and/or tape drives therein, as would be appreciated by one skilled in the art upon reading the present description. The end of an accessor channel 12 is shown at the end of the service bay 14 of data storage library 10 in FIG. 1, which may be implemented in a similar manner in the present embodiment of FIG. 11. However, the opening in service bay 14 at the end of the accessor channel 12 shown in FIG. 1 would preferably be sealed to prevent any transfer of air between the interior of the frames 1104, 1106, 1108, 1110 in FIG. 11 and the exterior.

Figure 11:
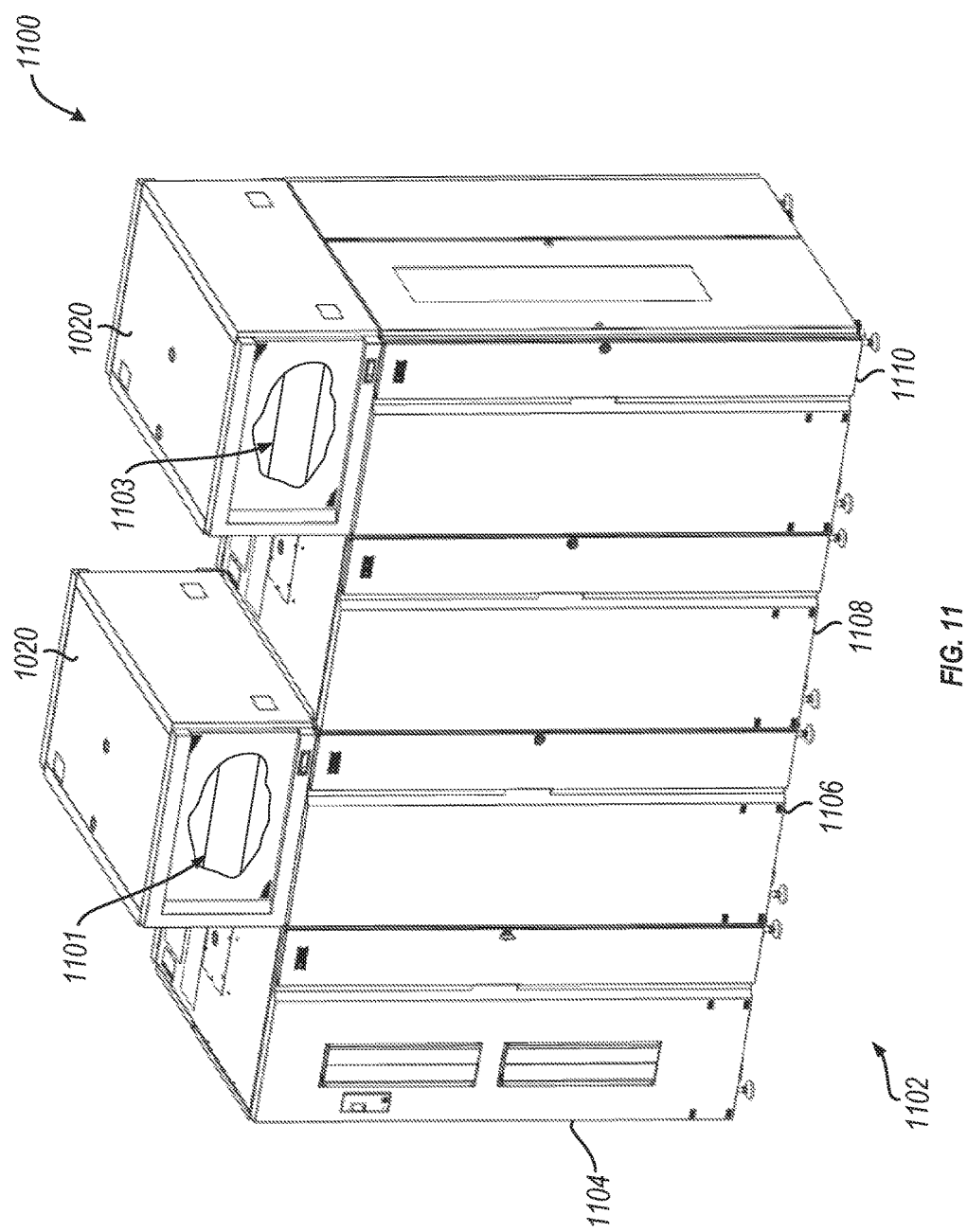
FIG. 11 is a perspective view of a system for storing magnetic recording media, in accordance with one embodiment.

With continued reference to FIG. 11, the accessor channels allow air flow to travel therealong between the frames 1104, 1106, 1108, 1110. Thus, an air conditioning unit may be able to provide conditioned (e.g., cooled, dehumidified, etc.) air to more than one frame by using the accessor channels to create an air flow along a series of frames. As a result, a smaller number of air conditioning units than storage frames may be included in some embodiments.

The first air conditioning unit 1101 is preferably configured such that a cooling capacity of the first air conditioning unit 1104 is sufficient (e.g., able) to cool an interior of at least a second frame, e.g., in addition to the frame 1106 to which it is directly coupled to. However, a cooling capacity of the first air conditioning unit 1020 may be sufficient to cool the interior of all of the frames 1104, 1106, 1108, 1110 in some approaches, e.g., by utilizing an accessor channel therein. Moreover, the first air conditioning unit 1101 may be configured to have a scalable cooling capacity, e.g., according to any of the approaches described herein. For example, the cooling capacity of the first air conditioning unit 1101 may be scaled based on operating conditions, e.g., such as heat loads inside and/or outside of the tape library frames, or portions thereof, according to any of the approaches described herein.

According to preferred approaches, each of the frames 1104, 1106, 1108, 1110 are preferably coupled to one of the sides of each other, thereby enabling the accessor channel to span between each of the frames 1104, 1106, 1108, 1110. However, in some approaches, frames may be separated from each other by a given amount of space. It is preferred that the amount of space separating each of the frames 1104, 1106, 1108, 1110 is minimized, thereby reducing the distance air from the first air conditioning unit 1101 travels before reaching the interior of each of the other frames. By reducing the distance air from the first air conditioning unit 1101 and/or second air conditioning unit 1103 travels, efficiency of the overall system may be improved, thereby desirably reducing operating costs and resource consumption. Moreover, the space in a datacenter housing data storage libraries may be more efficiently used by orienting automated tape library frames closer together, thereby reducing the amount of unused space therein.

With continued reference to FIG. 11, air is preferably directed from the first air conditioning unit 1101 to the interior the first frame 1106, e.g., when the first air conditioning unit 1101 is active. Similarly, air is preferably directed from the second air conditioning unit 1103 to the interior the frame 1110 coupled directly thereto, e.g., when the second air conditioning unit 1103 is active As described above, an inlet air duct may be used to direct the air flow from each of the air conditioning units 1101, 1103 to the interior of the respective frame 1106, 1110.

Once in the interior of the frame 1106, air flow from the first air conditioning unit 1101 passes into the area for storing tape cartridges. Referring back to the arrows 1024 shown in FIG. 10, some of the air flow continues past a vertical baffle and through the tape drives which may be included in the first frame 1106, while some of the air flow extends along the accessor channel, thereby providing conditioned air from the first air conditioning unit 1101 to the other frames 1104, 1108, 1110. Once in each of the other frames 1104, 1108, 1110, the air flow may follow a similar path as in frame 1106, e.g., continuing past vertical baffles and through tape drives which may be included therein. It should be noted that air is preferably returned back to the first air conditioning unit 1101, e.g., similar to the way that the air flow in the frame 1002 of FIG. 10 returns to the air conditioning unit 1012 therein. Referring still to FIG. 11, this unidirectional air flow may be achieved by utilizing one or more fans in one or more of the tape drives of any one or more of the frames 1104, 1106, 1108, 1110. In various approaches, conventional ducting may be used to connect the first and second frames, as well as to connect the second frame to the first air conditioning unit.

In some embodiments, the basic structure shown in FIG. 10 and/or FIG. 11 may be repeated any given number of times for large automated tape libraries with multiple frames with a multitude of tape drives. For example, a system may include a second frame of the same automated tape library, or a second automated tape library. According to another example, eighteen frames of a storage library may have ten air conditioning units coupled thereto.

It should be noted that when more than one air conditioning unit is included for a group of frames, exhaust ports and/or inlets of the air conditioning units may be relocated, e.g., to an upper surface of the air conditioning units. However, it is preferred if exhaust ports and inlets of the air conditioning units are sufficiently separated, e.g., such that hot air from an exhaust port is not drawn into another air conditioning unit through inlet thereof. Accordingly, in some approaches, inlets and/or exhaust ports may be located at other locations of the respective air conditioning unit 1101, 1103 and/or enclosure 1020.

It should be noted that the two air conditioning units 1101, 1103 may be operated together in the same manner and/or independently operated in different manners, depending on the desired embodiment. In some approaches, although two air conditioning units 1101, 1103 are included in FIG. 11, where there is interchange of the air between frames, e.g., along an accessor channel, only one air conditioning unit may be used at a given time to adjust the temperature and/or humidity for the interiors of the frames 1104, 1106, 1108, 1110, e.g., as described above. According to an example, which is in no way intended to limit the invention, a scalable cooling capacity of the first air conditioning unit 1101 may be used to adjust the temperature and/or humidity of the interiors of all frames 1104, 1106, 1108, 1110, while the second air conditioning unit 1103 remains idle. Moreover, in some approaches, the second air conditioning unit 1103 may be configured to be a redundant air conditioning unit. As such, the second air conditioning unit 1103 may only be activated when the first air conditioning unit 1101 fails, when a cooling capacity of the first air conditioning unit 1101 is insufficient to cool the interior of the frames 1104, 1106, 1108, 1110, etc. With reference to the present description, the second air conditioning unit 1103 may be "activated" by simply turning the second air conditioning unit 1103 on, or by adjusting a scalable cooling capacity thereof, e.g., see method 1200 below.

According to another example, a scalable cooling capacity of the second air conditioning unit 1103 may be used to adjust the temperature and/or humidity of one or more of the interiors of the frames 1104, 1106, 1108, 1110, while the first air conditioning unit 1101 remains idle. Thus, a cooling capacity of the second air conditioning unit 1103 may be able to cool the interior of each of the frames 1104, 1106, 1108, 1110. It follows that in some approaches, the first air conditioning unit 1101 may be configured to be a redundant air conditioning unit, such that the first air conditioning unit 1101 may only be activated when the second air conditioning unit 1103 fails, when a cooling capacity of the second air conditioning unit 1103 is insufficient to cool the interior of the frames 1104, 1106, 1108, 1110, etc.

According to yet another example, which again is in no way intended to limit the invention, the first and second air conditioning units 1101, 1103 may both be active to adjust the temperature and/or humidity of the interiors of the frames 1104, 1106, 1108, 1110. Moreover, baffle or baffles as described herein may also be configured to create hot and cold air separation in each of the frames 1104, 1106, 1108, 1110, e.g., as previously described. The embodiment illustrated in FIG. 11 preferably includes air flow from each of the air conditioning units 1101, 1103 to the interior of each of the frames 1104, 1106, 1108, 1110, and back again to the air conditioning units 1101, 1103 which may be actively adjusting the temperature and/or humidity of the interiors of the frames 1104, 1106, 1108, 1110. However, it follows that the frames 1104, 1106, 1108, 1110 may also be able to direct the air flow to each other, e.g. via an actuatable damper, via ducting, an accessor channel, etc. For example, if the first air conditioning unit 1101 is being used to adjust the temperature and/or humidity of the interior of the frames 1104, 1106, 1108, 1110, air flow from frame 1106 may be transferred to the other frames 1104, 1108, 1110 and back to the first air conditioning unit 1101 is preferably enabled. According to a similar embodiment, if the second air conditioning unit 1103 is being used to adjust the temperature and/or humidity of the interior of the frames 1104, 1106, 1108, 1110, air flow from frame 1110 may be transferred to the other frames 1104, 1106, 1108, 1110, and back to the second air conditioning unit 1103 is preferably enabled. As mentioned above, air flow may be generated by one or more tape drives in any one or more of the frames 1104, 1106, 1108, 1110. Moreover, the scalable cooling capacity of the second and/or first air conditioning units 1103, 1101 respectively, may be adjusted based on operating conditions, e.g., such as heat loads inside and/or outside of the frames 1104, 1106, 1108, 1110, or portions thereof.

As mentioned above, the ways to implement a "scalable cooling capacity" of the air conditioning units 1103, 1101 may vary. According to some approaches, scaling the cooling capacity of air conditioning units may include adjusting the quality (e.g., temperature, humidity, etc.) of the conditioned air output by each of the air conditioning units 1103, 1101. In other approaches, a scalable cooling capacity may include the ability to selectively activate only selected air conditioning units while deactivating others in tape libraries where an air conditioning unit conditions air for multiple frames.

Figure 12A:
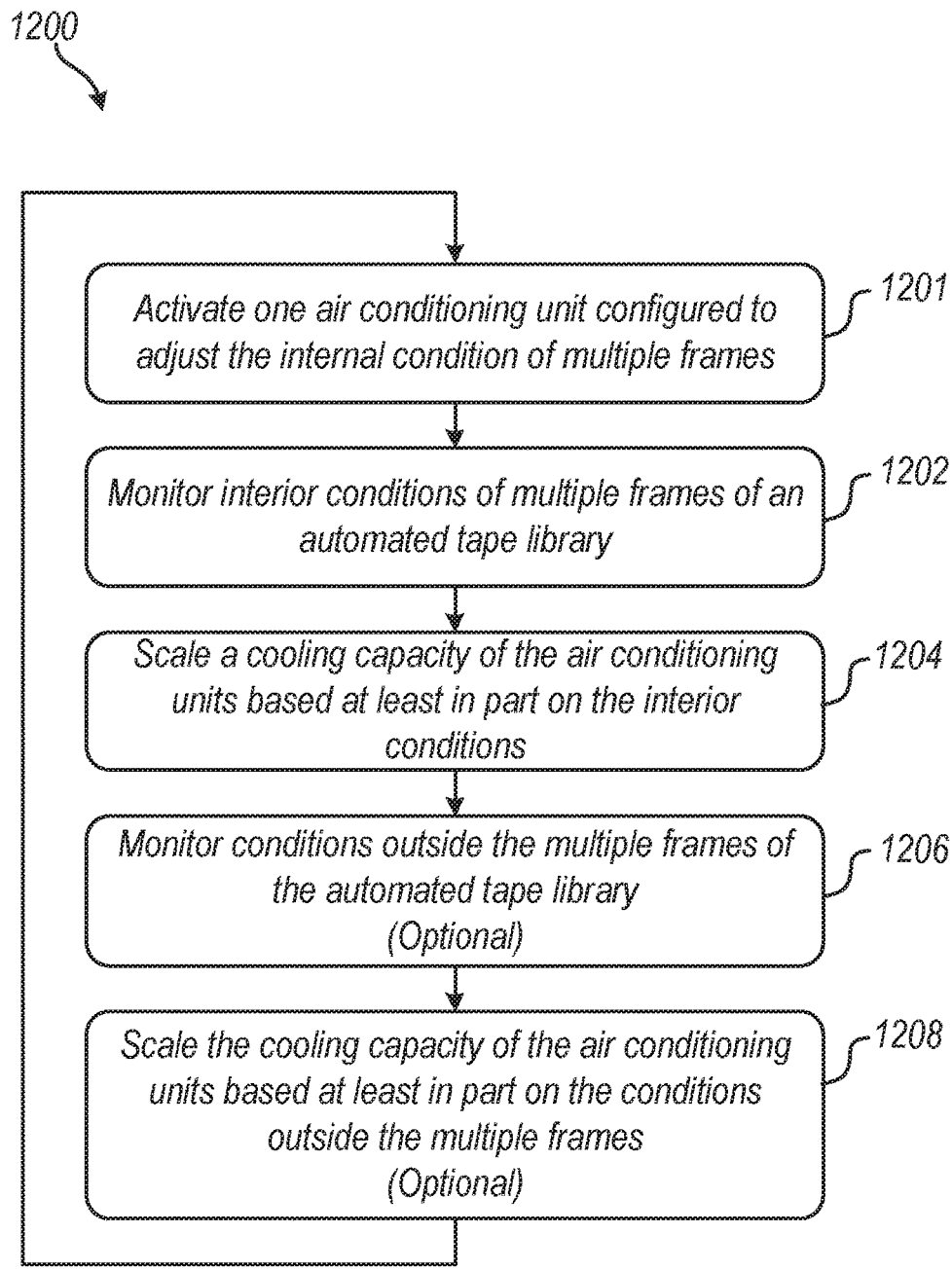
FIG. 12A is a flowchart of a method, in accordance with one embodiment.
Figure 12B:
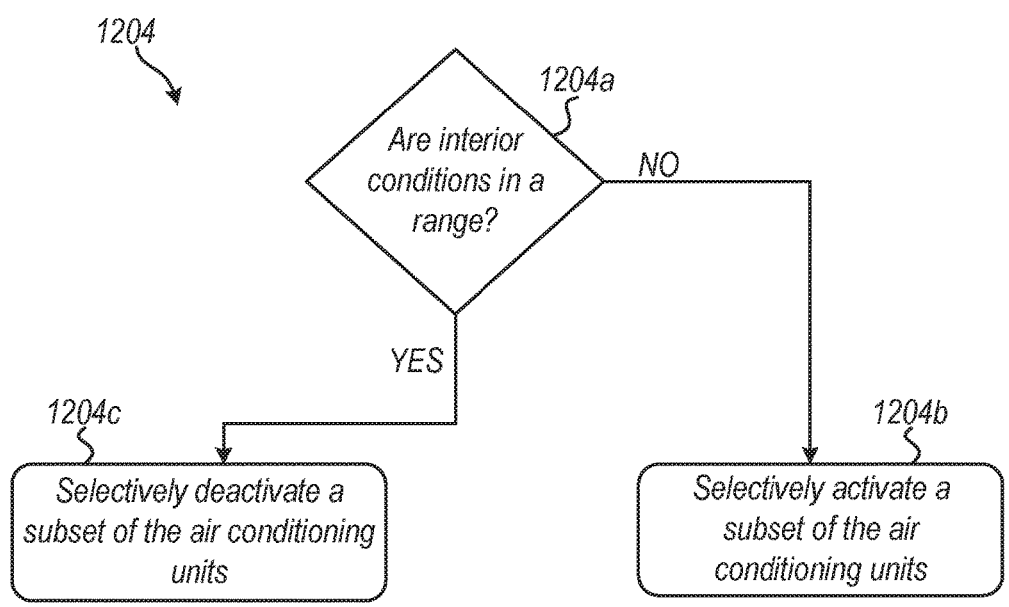
FIG. 12B is a flowchart of a process, in accordance with one embodiment.

Further still, FIGS. 12A-12B illustrates flowcharts of a method 1200 according to one embodiment. The method 1200 may be performed in accordance with the present invention in any of the environments depicted in FIGS. 1-11, among others, in various embodiments. Of course, more or less operations than those specifically described in FIGS. 12A-12B may be included in method 1200, as would be understood by one of skill in the art upon reading the present descriptions.

Each of the steps of the method 1200 may be performed by any suitable component of the operating environment. For example, in various embodiments, the method 1200 may be partially or entirely performed by a controller, a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 1200. Illustrative processors include, but are not limited to, a central processing unit (CPU), an application specific integrated circuit (ASIC), a field programmable gate array (FPGA), etc., combinations thereof, or any other suitable computing device known in the art.

Looking to FIG. 12A, operation 1201 includes activating one air conditioning unit configured to adjust the interior condition of multiple frames of a tape library. Moreover, operation 1202 of method 1200 includes monitoring interior conditions of multiple frames of an automated tape library. As mentioned above, the conditions that magnetic tape is exposed to have an effect on a lifespan of the magnetic tape. For instance, hot and/or humid conditions may degrade magnetic tape when exposed thereto. Thus, by monitoring the interior conditions of multiple frames of an automated library, method 1200 may be able to detect undesirable conditions for the magnetic tapes which may be stored in the multiple frames.

An interior of each of the multiple frames being monitored in operation 1202 may include one or more tape drives, an area for storing tape cartridges, a robotic accessor and/or any other components described in any of the embodiments described herein, e.g., see FIGS. 10-11. For example, an air conditioning unit is preferably coupled to an upper surface (top) of each of at least some of the multiple frames, e.g., as illustrated in FIG. 11.

With continued reference to FIG. 12, operation 1204 includes scaling a cooling capacity of air conditioning units based at least in part on the interior conditions. As previously mentioned, a scalable cooling capacity may include the ability to selectively activate only specific air conditioning units while deactivating other specific air conditioning units in tape libraries where multiple air conditioning units condition air for the same (common) multiple frames, e.g., via appropriate ducting or other form of air exchange among the frames. According to one example, each of four frames may have an air conditioning unit coupled thereto. One of the four air conditioning units may originally be activated to adjust (e.g., control) the interior conditions of all four frames. However, by monitoring the interior condition of the four frames, it may be determined that the active air conditioning unit is unable to maintain a desirable interior condition in all four of the frames when the interior conditions for the four common frames become undesirable, e.g., fall outside a range. In response, the scalable cooling capacity may be adjusted by activating second and third idle (e.g., redundant) air conditioning units in order to maintain the desired interior conditions for the four frames, e.g., see FIG. 12B. In other approaches, scaling the cooling capacity of air conditioning units may include adjusting the quality (e.g., temperature, humidity, continuous flow rate, etc.) of the conditioned air output by the active air conditioning unit. For example, the temperature of the air output by the single active air conditioning unit may be lowered in order to maintain a desired interior condition for all four of the frames.

Moreover, method 1200 further includes optional operations which are in no way intended to limit the invention. As shown, optional operation 1206 includes monitoring conditions outside the multiple frames of the automated tape library. Furthermore, optional operation 1208 includes scaling the cooling capacity of the air conditioning units based at least in part on the conditions outside the multiple frames. It follows that any of the approaches described herein may further be implemented as a monitoring system for monitoring the operating and/or external conditions, e.g., temperature, relative humidity, humidity, contaminates, etc., of the interior of automated tape library frames, and/or outside the tape library frames, and the effect those external conditions have on the operating conditions for the interior of automated tape library frames. For example, if the humidity outside a tape library frame is sufficiently high, cooling the interior of the frame, and correspondingly the surfaces of the frame, to a low enough temperature may undesirably cause condensation to form inside the frame. Therefore, the relationship between certain internal and external conditions may be designated as undesirable and avoided, e.g., by raising or lowering a temperature of the air output by an active air conditioning unit. Accordingly, it may be desirable to monitor the conditions outside the frames and adjust performance of air conditioning units accordingly.

Moreover, additional conditions may also be monitored. For example, an amount of return air supplied to the air conditioning units may be remotely monitored to ensure proper functioning of the air conditioning units and the proper operating environment for the tape drives and tape media. Monitoring systems may also be used to regulate power consumption, efficiency of the system (e.g., datacenter) overall, longevity of recording media, system failures, etc. According to an example, which is in no way intended to limit the invention, a monitoring system may be used to determine if any active air conditioning units have failed, e.g., by constantly monitoring the air conditioning units' output. In the case that one or more air conditioning units have failed, redundant (backup) air conditioning units may be activated, a user or service personnel may be informed (e.g., via an alert, message, etc.), frames coupled to the failed air conditioning unit(s) may be temporarily taken offline, etc.

As shown, the flow of method 1200 may return to operation 1202, whereby the operations of method 1200 may be repeated, e.g., thereby desirably providing continued monitoring of the conditions inside and/or outside the frames of a tape library. According to different approaches, the operations of method 1200 may be repeated upon request by a user, periodically, in response to a condition being met, automatically, etc.

Any one or more of the operations included in method 1200 may be implemented by different controllers, e.g., depending on the desired embodiment. In some embodiments, each of the air conditioning units may include a controller which implements the operations of method 1200. In other embodiments, a central controller capable of communicating with any of the plurality of air conditioning units (e.g., a tape library network managing controller) may be used to perform the operations of method 1200.

Looking to FIG. 12B, operation 1204 from 1200 is illustrated as including exemplary processes. However, it should be noted that the processes included in FIG. 12B are in no way intended to limit the invention, but rather are presented by way of example.

As shown, operation 1204 may include determining whether the interior conditions are in a range, e.g., below a predetermined temperature, below a predetermined humidity level, etc. See decision 1204a. As mentioned above, certain interior conditions for the frames may be undesirable in terms of avoiding degradation of magnetic tape stored therein. Thus, a range may be used to determine whether the conditions inside the frames are undesirable. According to various approaches, the range may be predetermined, calculated in real time, set by a user request, updated based on conditions external to the frames, etc. Moreover, it should be noted that "in a range" is in no way intended to limit the invention. Rather than determining whether a value is in a range, equivalent determinations may be made, e.g., as to whether a value is above a threshold, whether a value is inside a predetermined range, whether an absolute value is above a threshold, whether a value is below a threshold, etc., depending on the desired approach.

With continued reference to FIG. 12B, process 1204b includes selectively activating a subset of the air conditioning units in response to determining that the interior conditions are not in the range. Alternatively, process 1204c includes selectively deactivating a subset of the air conditioning units in response to determining that the interior conditions are in the range. When interior conditions are in a desired range, it may be beneficial to reduce the output of certain air conditioning units (e.g., raise the temperature of air exiting the air conditioning unit), or even deactivate a selective number of air conditioning units that are adjusting the interior conditions of a common set of frames, e.g., to reduce power consumption.

Moreover, the continued monitoring of the interior conditions may be used to ensure that the interior conditions do not shift outside ranges in response to deactivating the subset of air conditioning units, changing external conditions, increased tape drive activity inside the frames, etc. Thus, subsets of air conditioning units configured to adjust the conditions of a common group of frames may be selectively activated and deactivated as needed, thereby achieving scalable cooling capacity.

In some approaches, all air conditioning units of a system may be selectively controlled as a network (e.g., by a central controller) in order to ensure efficient operation of a tape library despite changing conditions inside and/or outside frames of the tape library.

It should also be noted that optional operations 1206 and/or 1208 may include any of the processes described above in FIG. 12B. According to an example, scaling the cooling capacity of the air conditioning units based on the conditions outside the multiple frames may include determining whether any of the conditions outside the multiple frames are in a range, and selectively activating and/or deactivating subsets of the air conditioning units, as described herein, based on the determination.

It follows that various embodiments described and/or suggested herein are able to provide data storage systems, more specifically, automated tape libraries with climate control capabilities integrated with the automated tape library. As a result, favorable conditions (e.g., temperature, humidity, presence of contaminants, etc.) may be maintained for the tape drives and/or media which may be stored in the library frame. Moreover, these favorable conditions may enable a system to provide the appropriate temperature, humidity, contaminant level, etc. regardless of whether the library is installed in an unfavorable (e.g., hot and/or wet) datacenter location.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as controller 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
a first frame of an automated tape library, wherein an interior of the first frame includes one or more tape drives, an area for storing tape cartridges, and an accessor channel;
a second frame of the automated tape library, wherein an interior of the second frame includes one or more tape drives, an area for storing tape cartridges, and a second accessor channel; and
a first air conditioning unit coupled to the first frame, wherein the first air conditioning unit is configured such that a cooling capacity of the first air conditioning unit is able to cool the interior of the first frame in addition to an interior of the second frame,
wherein one or more fans of the one or more tape drives in the first frame are configured to generate air flow within the interior of the first frame,
wherein one or more fans of the one or more tape drives in the second frame are configured to generate air flow within the interior of the second frame,
wherein the first air conditioning unit is coupled to an upper surface of the first frame,
wherein a first subset of the generated air flow is a unidirectional air flow within the interior of the first frame which circulates from the first air conditioning unit, to the interior of the first frame, and back to the first air conditioning unit during operation of the first air conditioning unit,
wherein a second subset of the generated air flow is a unidirectional air flow within the interior of the first and second frames which circulates from the first air conditioning unit, to the interior of the first frame, to the interior of the second frame, and back to the first air conditioning unit during operation of the first air conditioning unit,
wherein the first air conditioning unit is able to reduce relative humidity.

2. The system as recited in claim 1, the first frame comprising a baffle or baffles, wherein the baffle or baffles are configured to isolate hot air exiting the tape drives in the first frame from the area for storing tape cartridges in the first frame, wherein the accessor channel and the second accessor channel are configured to allow at least a portion of the second subset of the generated air flow to pass between the first and second frames.

3. The system as recited in claim 1, wherein the one or more fans of the one or more tape drives in the first frame are the only fans that generate the air flow within the interior of the first frame, wherein the one or more fans of the one or more tape drives in the first frame are configured to create a pressure differential on opposite sides of the one or more tape drives which generates the air flow within the interior of the first frame.

4. The system as recited in claim 1, comprising a second air conditioning unit coupled to the second frame, wherein the area for storing tape cartridges in the second frame of the automated tape library include multi-cartridge deep slot cells and single cartridge storage slots.

5. The system as recited in claim 4, wherein the second air conditioning unit is configured to be a redundant air conditioning unit, wherein a cooling capacity of the second air conditioning unit is capable of cooling the interior of the second frame and the interior of the first frame in response to the second air conditioning unit being activated, wherein the second air conditioning unit is activated in response to determining that the first air conditioning unit has failed.

6. The system as recited in claim 5, wherein the first air conditioning unit is configured to have a scalable cooling capacity, wherein the second air conditioning unit is configured to have a scalable cooling capacity.

7. The system as recited in claim 6, wherein the cooling capacities of the first and second air conditioning units are scalable based on operating conditions inside and/or outside of the first and/or second frames, wherein the one or more fans of the one or more tape drives in the first frame are configured to create a pressure differential on opposite sides of the one or more tape drives in the first frame which generates the air flow within the interior of the first frame, wherein one or more fans of the one or more tape drives in the second frame are configured to create a pressure differential on opposite sides of the one or more tape drives which generates the air flow within the interior of the second frame.

8. A system, comprising:

a first frame of an automated tape library, wherein an interior of the first frame includes an area for storing tape cartridges and an accessor channel;

a first air conditioning unit coupled to an upper surface of the first frame; and a second frame of the automated tape library, wherein an interior of the second frame includes an area for storing tape cartridges and a second accessor channel, wherein the first air conditioning unit is configured such that a cooling capacity of the first air conditioning unit is able to cool the interiors of the first and second frames, wherein the first air conditioning unit is configured to have a scalable cooling capacity, wherein one or more fans of one or more tape drives in the first and second frames are configured to create a pressure differential on opposite sides of the one or more tape drives which generates air flow within the interior of the first and second frames, wherein a subset of the generated air flow is a unidirectional air flow within the interior of the first and second frames which circulates from the first air conditioning unit, to the interior of the first frame, to the interior of the second frame, and back to the first air conditioning unit during operation of the first air conditioning unit.

9. The system as recited in claim 8, wherein the first air conditioning unit is coupled to an upper surface of the first frame, wherein the accessor channel and the second accessor channel are configured to allow at least a portion of the subset of the generated air flow to pass between the first and second frames, wherein the area for storing tape cartridges included in the interior of the second frame includes multi-cartridge deep slot cells and single cartridge storage slots, wherein the area for storing tape cartridges included in the interior of the first frame includes multi-cartridge deep slot cells and single cartridge storage slots.

10. The system as recited in claim 8, comprising:

a baffle or baffles in the first frame, wherein the baffle or baffles in the first frame are configured to isolate hot air exiting the tape drives from the area for storing tape cartridges in the first frame; and a baffle or baffles in the second frame, wherein the baffle or baffles in the second frame are configured to isolate hot air exiting the tape drives from the area for storing tape cartridges.

11. The system as recited in claim 10, wherein the one or more fans of the one or more tape drives in the first frame are the only fans that generate the air flow within the interior of the first frame, wherein the one or more fans of the one or more tape drives in the second frame are the only fans that generate the air flow within the interior of the second frame.

12. The system as recited in claim 8, comprising a second air conditioning unit coupled to an upper surface of the second frame, wherein the second air conditioning unit is configured to have a scalable cooling capacity, wherein the second air conditioning unit is configured to be a redundant air conditioning unit, wherein a cooling capacity of the second air conditioning unit is capable of cooling the interior of the second frame and the interior of the first frame in response to the second air conditioning unit being activated, wherein the second air conditioning unit is activated in response to determining that the first air conditioning unit has failed.

13. The system as recited in claim 12, wherein each of the first and second frames include a baffle or baffles, wherein the baffle or baffles in the first frame is configured to isolate hot air exiting tape drives in the first frame from the area for storing tape cartridges in the first frame.

14. The system as recited in claim 13, wherein the cooling capacities of the first and second air conditioning units are scalable based on operating conditions inside and outside of the first and second frames, wherein the one or more fans of the one or more tape drives in the second frame are the only fans that generate the air flow within the interior of the second frame.

15. A computer-implemented method, comprising:

monitoring interior conditions of first and second frames of an automated tape library, wherein an interior of each of the first and second frames includes one or more tape drives, an area for storing tape cartridges and an accessor channel, wherein first and second air conditioning units are directly coupled to the first and second frames, respectively; and scaling a cooling capacity of the first and second air conditioning units based at least in part on the interior conditions, wherein the first air conditioning unit is configured to cool the interior of the first frame, wherein one or more fans of the one or more tape drives in the first frame are configured to generate air flow within the interior of the first frame, wherein the first air conditioning unit is coupled to an upper surface of the first frame, wherein the first air conditioning unit is configured such that a cooling capacity of the first air conditioning unit is able to cool an interior of the second frame in addition to the interior of the first frame, wherein a first subset of the generated air flow is a unidirectional air flow within the interior of the first frame which circulates from the first air conditioning unit, to the interior of the first frame, and back to the first air conditioning unit during operation of the first air conditioning unit, wherein a second subset of the generated air flow is a unidirectional air flow within the interior of the first and second frames which circulates from the first air conditioning unit, to the interior of the first frame, to the interior of the second frame, and back to the first air conditioning unit during operation of the first air conditioning unit, wherein the first air conditioning unit is able to reduce relative humidity.

16. A library controller configured to perform the computer-implemented method as recited in claim 15, wherein the library controller is coupled to the automated tape library, wherein scaling the cooling capacity of the first and second air conditioning units includes:

determining whether the interior conditions are in a range;

selectively activating a subset of the first and second air conditioning units in response to determining that the interior conditions are in the range; and selectively deactivating a subset of the first and second air conditioning units in response to determining that the interior conditions are outside the range, wherein monitoring the interior conditions of the multiple frames includes receiving readings from multiple sensors included in the interior of the first and second frames.

17. The computer-implemented method as recited in claim 15, comprising:

monitoring conditions outside the first and second frames; and scaling the cooling capacity of the first and second air conditioning units based at least in part on the conditions outside the first and second frames.

18. The computer-implemented method as recited in claim 15, wherein the first and second frames include a baffle or baffles, wherein the baffle or baffles in the first frame are configured to isolate hot air exiting the one or more tape drives in the first frame from the area for storing tape cartridges in the first frame, wherein one or more fans of the one or more tape drives in each of the first and second frames are configured to create a pressure differential on opposite sides of the one or more tape drives which generates air flow within the interior of the respective frame, wherein the interior conditions include temperature and/or relative humidity.

* * * * *